(12) United States Patent
Shulaker et al.

(10) Patent No.: US 11,626,486 B2
(45) Date of Patent: Apr. 11, 2023

(54) BACK-GATE FIELD-EFFECT TRANSISTORS AND METHODS FOR MAKING THE SAME

(71) Applicant: Massachusetts Institute of Technology, Cambridge, MA (US)

(72) Inventors: Max Shulaker, Weston, MA (US); Tathagata Srimani, Cambridge, MA (US); Samuel Fuller, Cambridge, MA (US); Yosi Stein, Norwood, MA (US); Denis Murphy, Norwood, MA (US)

(73) Assignees: Massachusetts Institute of Technology, Cambridge, MA (US); Analog Devices, Inc., Norwood, MA (US)

(*) Notice: Subject to any disclaimer, the term of this patent is extended or adjusted under 35 U.S.C. 154(b) by 0 days.

(21) Appl. No.: 16/966,893

(22) PCT Filed: Jan. 29, 2019

(86) PCT No.: PCT/US2019/015595
§ 371 (c)(1),
(2) Date: Aug. 1, 2020

(87) PCT Pub. No.: WO2019/148170
PCT Pub. Date: Aug. 1, 2019

(65) Prior Publication Data
US 2021/0050417 A1 Feb. 18, 2021

Related U.S. Application Data

(60) Provisional application No. 62/623,277, filed on Jan. 29, 2018.

(51) Int. Cl.
*H01L 29/06* (2006.01)
*H01L 51/00* (2006.01)
*H01L 51/05* (2006.01)

(52) U.S. Cl.
CPC ...... *H01L 29/0673* (2013.01); *H01L 51/0048* (2013.01); *H01L 51/055* (2013.01); *H01L 51/057* (2013.01)

(58) Field of Classification Search
CPC ............ H01L 29/0673; H01L 51/0048; H01L 51/055; H01L 51/057; B82Y 10/00
See application file for complete search history.

(56) References Cited

U.S. PATENT DOCUMENTS 6,191,724 B1 * 2/2001 McEwan .................. G01S 7/35
342/118
6,462,929 B2 10/2002 Compton et al.
(Continued)

FOREIGN PATENT DOCUMENTS

| EP | 0190070 B1 | 8/1992 |
|---|---|---|
| WO | 2014113722 A1 | 7/2014 |
| WO | 2017001406 A3 | 4/2017 |

OTHER PUBLICATIONS

Wei et al., "Carbon Nanotube Circuits: Opportunities and Challenges," EDAA (Year: 2013).*
(Continued)

*Primary Examiner* — Ahmed N Sefer
(74) *Attorney, Agent, or Firm* — Smith Baluch LLP

(57) ABSTRACT

A back-gate carbon nanotube field effect transistor (CNFETs) provides: (1) reduced parasitic capacitance, which decreases the energy-delay product (EDP) thus improving the energy efficiency of digital systems (e.g., very-large-scale integrated circuits) and (2) scaling of transistors to smaller technology nodes (e.g., sub-3 nm nodes). An exemplary back-gate CNFET includes a channel. A source and a drain are disposed on a first side of the channel. A gate is disposed on a second side of the channel opposite to the first side. In this manner, the contacted gate pitch (CGP) of the back-gate CNFET may be scaled down without scaling the (Continued)

physical gate length ($L_G$) or contact length ($L_C$). The gate may also overlap with the source and/or the drain in this architecture. In one example, an exemplary CNFET was demonstrated to have a CGP less than 30 nm and 1.6× improvement to EDP compared to top-gate CNFETs.

18 Claims, 21 Drawing Sheets

(56) References Cited

U.S. PATENT DOCUMENTS

| | | | |
|---|---|---|---|
| 7,598,544 | B2 | 10/2009 | Bertin et al. |
| 7,859,385 | B2* | 12/2010 | Bertin ............ H01C 17/0652 |
| | | | 338/195 |
| 8,288,236 | B2* | 10/2012 | Chang ............ H01L 51/0541 |
| | | | 257/E21.409 |
| 8,557,659 | B2 | 10/2013 | Teo et al. |
| 8,685,815 | B2 | 4/2014 | Ahn et al. |
| 8,772,141 | B2 | 7/2014 | Afzali-Ardakani et al. |
| 8,785,911 | B2 | 7/2014 | Chen et al. |
| 8,946,007 | B2 | 2/2015 | Doris et al. |
| 9,209,288 | B2 | 12/2015 | Avci et al. |
| 9,613,879 | B2 | 4/2017 | Hersam et al. |
| 10,256,320 | B1* | 4/2019 | Liu ............ H01L 21/823814 |
| 11,062,067 | B2 | 7/2021 | Hills et al. |
| 2004/0099438 | A1 | 5/2004 | Arthur et al. |
| 2005/0181587 | A1* | 8/2005 | Duan ............ H01F 1/405 |
| | | | 438/551 |
| 2006/0115640 | A1 | 6/2006 | Yodh et al. |
| 2006/0183278 | A1 | 8/2006 | Bertin et al. |
| 2006/0204427 | A1 | 9/2006 | Ghenciu et al. |
| 2007/0281409 | A1* | 12/2007 | Zhang ............ H01L 29/1033 |
| | | | 257/E29.051 |
| 2008/0099842 | A1* | 5/2008 | Gyoujin ............ H01L 29/0665 |
| | | | 977/750 |
| 2008/0210987 | A1 | 9/2008 | Bondavalli et al. |
| 2009/0184346 | A1 | 7/2009 | Jain |
| 2010/0111813 | A1 | 5/2010 | Fan |
| 2010/0207208 | A1* | 8/2010 | Bedell ............ B82Y 10/00 |
| | | | 257/E21.409 |
| 2011/0045660 | A1* | 2/2011 | Romano ............ H01L 51/0012 |
| | | | 977/890 |
| 2011/0147715 | A1 | 6/2011 | Rogers et al. |
| 2012/0129273 | A1 | 5/2012 | Johnson, Jr. et al. |
| 2012/0326126 | A1* | 12/2012 | Chen ............ H01L 51/0023 |
| | | | 257/29 |
| 2013/0134394 | A1* | 5/2013 | Zhou ............ H01L 51/0012 |
| | | | 257/29 |
| 2014/0008606 | A1* | 1/2014 | Hussain ............ H01L 29/66484 |
| | | | 438/306 |
| 2014/0017886 | A1* | 1/2014 | Teo ............ H01L 27/088 |
| | | | 438/587 |
| 2014/0175376 | A1* | 6/2014 | Avci ............ H01L 29/205 |
| | | | 257/12 |
| 2015/0227669 | A1 | 8/2015 | Joshi et al. |
| 2015/0318504 | A1* | 11/2015 | Xiao ............ H01L 51/0021 |
| | | | 438/157 |
| 2015/0370948 | A1 | 12/2015 | Kawa et al. |
| 2016/0123919 | A1 | 5/2016 | Johnson et al. |
| 2016/0133843 | A1 | 5/2016 | Rogers et al. |
| 2016/0147934 | A1 | 5/2016 | Keller et al. |
| 2016/0190492 | A1 | 6/2016 | Li et al. |
| 2017/0005140 | A1 | 1/2017 | Bertin |
| 2017/0162710 | A1* | 6/2017 | Shih ............ H01L 29/78693 |
| 2017/0179283 | A1* | 6/2017 | Pourghaderi ...... H01L 29/42376 |
| 2017/0294583 | A1* | 10/2017 | Liang ............ H01L 51/0545 |
| 2019/0189775 | A1* | 6/2019 | Liu ............ H01L 21/823885 |
| 2019/0341450 | A1* | 11/2019 | Lee ............ H01L 29/66545 |
| 2019/0378998 | A1* | 12/2019 | Sakii ............ H01L 51/0003 |
| 2020/0082032 | A1 | 3/2020 | Hills et al. |
| 2021/0247356 | A1 | 8/2021 | Shulaker et al. |
| 2021/0294959 | A1 | 9/2021 | Hills et al. |
| 2021/0313530 | A1 | 10/2021 | Lau et al. |
| 2021/0351354 | A1 | 11/2021 | Lau et al. |

OTHER PUBLICATIONS

Wu et al., "Hyperdimensional computing exploiting carbon nanotube FETs, resistive RAM, and their monolithic 3D integration." IEEE Journal of Solid-State Circuits 53.11 (2018): 3183-3196.

Xu et al., "Efficient and reversible electron doping of semiconductor-enriched single-walled carbon nanotubes by using decamethylcobaltocene." Scientific reports 7.1 (2017): 1-10.

Yakimets et al., "Power aware FinFET and lateral nanosheet FET targeting for 3nm CMOS technology." Electron Devices Meeting (IEDM), 2017 IEEE International. IEEE, 2017. 4 pages.

Yang et al., "High-performance complementary transistors and medium-scale integrated circuits based on carbon nanotube thin films." ACS nano 11.4 (2017): 4124-4132.

Yoshida et al., "Highly conductive metal gate fill integration solution for extremely scaled RMG stack for 5 nm & beyond." Electron Devices Meeting (IEDM), 2017 IEEE International. IEEE, 2017. 4 pages.

Zhang et al., "Air-stable conversion of separated carbon nanotube thin-film transistors from p-type to n-type using atomic layer deposition of high-κ oxide and its application in CMOS logic circuits." Acs Nano 5.4 (2011): 3284-3292.

Zhang et al., "Carbon nanotube correlation: promising opportunity for CNFET circuit yield enhancement." Proceedings of the 47th Design Automation Conference. 2010. 4 pages.

Zhang et al., "Doping-free fabrication of carbon nanotube based ballistic CMOS devices and circuits." Nano Letters 7.12 (2007): 3603-3607.

Zhang et al., "High-performance carbon nanotube complementary electronics and integrated sensor systems on ultrathin plastic foil" ACS nano 12 3 (2018): 2773-2779.

Zhang et al., "Selective etching of metallic carbon nanotubes by gas-phase reaction." Science 314.5801 (2006): 974-977.

Zhao et al., "Sub-10 nm diameter InGaAs vertical nanowire MOSFETs." Electron Devices Meeting (IEDM), 2017 IEEE International. IEEE, 2017 4 pages.

Zhong et al., "Solution-processed carbon nanotubes based transistors with current density of 1.7 mA/μm and peak transconductance of 0.8 mS/μm." 2017 IEEE International Electron Devices Meeting (IEDM). IEEE, 2017. 5 pages.

Li et al., "Facile method for enhancing conductivity of printed carbon nanotubes electrode via simple rinsing process." Organic Electronics 47 (2017): 174-180.

Liebmann et al., "Overcoming scaling barriers through design technology cooptimization." VLSI Technology, 2016 IEEE Symposium on. IEEE, 2016. 2 pages.

Lin et al., "ACCNT—A metallic-CNT-tolerant design methodology for carbon-nanotube VLSI: Concepts and experimental demonstration" IEEE Transactions on Electron Devices 56.12 (2009): 2969-2978.

Liu et al., Carbon Nanotube-Based Three-Dimensional Monolithic Optoelectronic Integrated System. Nat. Commun. 2017, 8, 15649. 8 pages.

Markov et al., "Progress and challenges in VLSI placement research." Proceedings of the IEEE 103.11 (2015): 1985-2003.

McClellan et al., Effective N-Type Doping of Monolayer MoS2 by AlOx. In 2017 75th Annual Device Research Conference (DRC); IEEE, 2017; 1-2.

Mistry, 10 nm Technology Leadership. Leading at the edge technology and manufacturing day 2017. Intel. Accessed at https://newsroom.intel.com/newsroom/wp-content/uploads/sites/11/2017/03/Kaizad-Mistry-2017-Manufacturing.pdf. 37 pages.

Narasimha et al., "A 7nm CMOS technology platform for mobile and high performance compute application." Electron Devices Meeting (IEDM), 2017 IEEE International. IEEE, 2017. 4 pages.

Niemetz, et al., Boolector 2.0. Journal on Satisfiability, Boolean Modeling and Computation 9 (2015) 53-58.

(56) References Cited

OTHER PUBLICATIONS

Nourbakhsh et al., "MoS2 field-effect transistor with sub-10 nm channel length." Nano letters 16.12 (2016): 7798-7806.
NVIDIA RISC-V Story. NVIDIA 4th RISC-V Workshop Jul. 2016. Accessed at https://riscv.org/wp-content/uploads/2016/07/Tue1100_Nvidia_RISCV_Story_V2.pdf. 15 pages.
Open Source RISC-V Cores and Tools. Bluespec. Accessed at https://bluespec.com/ on Feb. 13, 2020. 5 pages.
OpenSPARC Overview. Oracle Accessed at http://www.opensparc.net/opensparc-t2 on Feb. 13, 2020. 1 pages.
Patil et al., "VMR: VLSI-compatible metallic carbon nanotube removal for imperfection-immune cascaded multi-stage digital logic circuits using carbon nanotube FETs." 2009 IEEE International Electron Devices Meeting (IEDM). IEEE, 2009. 4 pages.
Patterson, "50 Years of computer architecture: From the mainframe CPU to the domain-specific tpu and the open RISC-V instruction set." 2018 IEEE International Solid-State Circuits Conference-(ISSCC). IEEE, 2018. 5 pages.
Prakash et al., Understanding Contact Gating in Schottky Barrier Transistors from 2D Channels. Sci. Rep. 2017, 7, 12596. 9 pages.
Qiu et al., "Scaling carbon nanotube complementary transistors to 5-nm gate lengths." Science355.6322 (2017): 271-276.
Rai et al., Air Stable Doping and Intrinsic Mobility Enhancement in Monolayer Molybdenum Disulfide by Amorphous Titanium Suboxide Encapsulation. Nano Lett. 2015, 15, 4329-4336.
Rai et al., Interfacial-Oxygen-Vacancy Mediated Doping of MoS2 by high-k dielectrics. In 2015 73rd Annual Device Research Conference (DRC); IEEE, 2015; 189-190.
Sabry et al., Energy-Efficient Abundant-Data Computing: The N3XT 1,000x. Computer (Long. Beach. Calif). 2015, 48, 24-33.
Semiconductor Industry Association. "International Technology Roadmap for Semiconductors (2013)." Downloaded from http://www.itrs2.net/itrs-reports.html on Feb. 24, 2020. 237 pages.
Seo et al., "A 10nm platform technology for low power and high performance application featuring FINFET devices with multi workfunction gate stack on bulk and SoI" Vlsi Technology (VLSI-Technology): Digest of Technical Papers, 2014 Symposium on. IEEE, 2014. 2 pages.
Shahrjerdi et al., "High-performance air-stable n-type carbon nanotube transistors with erbium contacts." ACS nano 7.9 (2013): 8303-8308.
Sherazi et al., "Track height reduction for standard-cell in below 5nm node: how low can you go?." Design-Process-Technology Co-optimization for Manufacturability XII. vol. 10588. International Society for Optics and Photonics, 2018. 14 pages.
Shulaker et al., "Carbon nanotube circuit integration up to sub-20 nm channel lengths." ACS nano 8.4 (2014): 3434-3443.
Shulaker et al., "Carbon nanotube computer." Nature 501.7468 (2013): 526-530.
Shulaker et al., "Efficient metallic carbon nanotube removal for highly-scaled technologies." 2015 IEEE International Electron Devices Meeting (IEDM). IEEE, 2015. 4 pages.
Shulaker et al., "Experimental demonstration of a fully digital capacitive sensor interface built entirely using carbon-anotube FETs." 2013 IEEE International Solid-State Circuits Conference Digest of Technical Papers. IEEE, 2013. 3 pages.
Shulaker et al., "Linear increases in carbon nanotube density through multiple transfer technique." Nano letters 11.5 (2011): 1881-1886.
Shulaker et al., "Monolithic 3D integration of logic and memory: Carbon nanotube FETs, resistive RAM, and silicon FETs " 2014 IEEE International Electron Devices Meeting. IEEE, 2014. 4 pages.
Shulaker et al., "Monolithic three-dimensional integration of carbon nanotube FETs with silicon CMOS." 2014 Symposium on VLSI Technology (VLSI-Technology): Digest of Technical Papers. IEEE, 2014. 2 pages.
Shulaker et al., "Sensor-to-digital interface built entirely with carbon nanotube FETs." IEEE Journal of Solid-State Circuits 49.1 (2013): 190-201.
Shulaker et al., "Three-dimensional integration of nanotechnologies for computing and data storage on a single chip." Nature 547.7661 (2017): 74. 19 pages.
Shulaker et al., High-Performance Carbon Nanotube Field-Effect Transistors. In 2014 IEEE International Electron Devices Meeting; IEEE, 2014; 33.6.1-33.6.4.
Si et al., "Scalable preparation of high-density semiconducting carbon nanotube arrays for high-performance field-affect transistors." ACS nano 12.1 (2018): 627-634.
Spike, a RISC-V ISA Simulator. Github. Accessed at https://github.com/riscv/riscv-isa-sim on Feb. 13, 2020. 6 pages.
Suriyasena Liyanage et al., VLSI-Compatible Carbon Nanotube Doping Technique with Low Work-Function Metal Oxides. Nano Lett. 2014, 14, 1884-1890.
Tang et al., "Flexible CMOS integrated circuits based on carbon nanotubes with sub-10 ns stage delays." Nature Electronics 1.3 (2018): 191-196.
Tans et al., "Room-temperature transistor based on a single carbon nanotube." Nature 393.6680 (1998): 49-52.
Tulevski et al., "High purity isolation and quantification of semiconducting carbon nanotubes via col. chromatography." ACS nano 7.4 (2013): 2971-2976.
Tulevski et al., "Toward high-performance digital logic technology with carbon nanotubes." ACS nano 8.9 (2014): 8730-8745.
Valsaraj et al., Theoretical and Experimental Investigation of Vacancy-Based Doping of Monolayer MoS 2 on Oxide. 2D Mater. 2015, 2, 045009. 12 pages.
Vinet et al., "3D monolithic integration: Technological challenges and electrical results." Microelectronic Engineering88.4 (2011): 331-335.
Wang et al., "Growing highly pure semiconducting carbon nanotubes by electrotwisting the helicity." Nature Catalysis 1.5 (2018): 326-331.
Wei et al. "A non-iterative compact model for carbon nanotube FETs incorporating source exhaustion effects." 2009 EEE International Electron Devices Meeting (IEDM). IEEE, 2009. 4 pages.
Western Digital To Accelerate The Future Of Next-Generation Computing Architectures For Big Data And Fast Data Environments. Western Digital Nov. 28, 2017. Accessed at https://www.westerndigital.com/company/newsroom/press-releases/2017/2017-11-28-western-digital-to-accelerate-the-future-of-next-generation-computing-architectures-for-big-data-and-fast-data-environments. 7 pages.
Wolf, RISC-V Formal Verification Framework. Github. Accessed at https://github.com/cliffordwolf/riscv-formal. 2 pages.
Wolf, SymbiYosys (sby)—Front-end for Yosys-based formal verification flows. Github. Accessed at https://github.com/YosysHQ/SymbiYosys on Feb. 13, 2020. 1 pages.
Won et al., "Zipping, entanglement, and the elastic modulus of aligned single-walled carbon nanotube films" Proceedings of the National Academy of Sciences 110.51 (2013): 20426-20430.
Wu et al., "Brain-inspired computing exploiting carbon nanotube FETs and resistive RAM: Hyperdimensional computing case study." 2018 IEEE International Solid-State Circuits Conference-(ISSCC). IEEE, 2018, pp. 492-494.
A formal semantics of the RISC-V ISA in Haskell Github. Accessed at https://github.com/mit-plv/riscv-semantics on Feb. 13, 2020. 3 pages.
Aly et al., "Energy-efficient abundant-data computing: The N3XT 1,000 x." Computer 48.12 (2015): 24-33.
Aly et al., "The N3XT approach to energy-efficient abundant-data computing." Proceedings of the IEEE 107.1 (2018): 19-48.
Appenzeller, Carbon Nanotubes for High-Performance Electronics—Progress and Prospect. Proc. IEEE 2008, 96, 201-211.
Aria et al., Parameter Space of Atomic Layer Deposition of Ultrathin Oxides on Graphene. ACS Appl. Mater. Interfaces 2016, 8, 30564-30575.
Asanovic et al., The berkeley out-of-order machine (boom): An industry-competitive, synthesizable, parameterized risc-v processor. No. UCB-EECS-2015-167. University of California at Berkeley Berkeley United States, 2015. 5 pages.

(56) References Cited

OTHER PUBLICATIONS

Bardon et al., "Extreme scaling enabled by 5 tracks cells: Holistic design-device co-optimization for FinFETs and lateral nanowires." Electron Devices Meeting (IEDM), 2016 IEEE International. IEEE, 2016.
Batude et al., "Advances, challenges and opportunities in 3D CMOS sequential integration." 2011 International Electron Devices Meeting. IEEE, 2011. 4 pages.
Brady et al., "Polyfluorene-sorted, carbon nanotube array field-effect transistors with increased current density and high on/off ratio." ACS nano 8.11 (2014): 11614-11621.
Brady et al., "Quasi-ballistic carbon nanotube array transistors with current density exceeding Si and GaAs." Science advances 2.9 (2016): e1601240. 10 pages.
Cao et al., "Arrays of single-walled carbon nanotubes with full surface coverage for high-performance electronics." Nature nanotechnology 8.3 (2013): 180. 7 pages.
Cao et al., "Carbon nanotube transistors scaled to a 40-nanometer footprint." Science 356.6345 (2017): 1369-1372.
Cao et al., "End-bonded contacts for carbon nanotube transistors with low, size-independent resistance." Science350.6256 (2015): 68-72.
Cao et al., "Medium-scale carbon nanotube thin-film integrated circuits on flexible plastic substrates." Nature 454.7203 (2008): 495-500.
Chen et al., "Externally assembled gate-all-around carbon nanotube field-effect transistor." IEEE electron device letters 29.2 (2008): 183-185.
Chen et al., The Role of Metal-Nanotube Contact in the Performance of Carbon Nanotube Field-Effect Transistors. Nano Lett. 2005, 5, 1497-1502.
Clark et al., "ASAP7: A 7-nm finFET predictive process design kit." Microelectronics Journal 53 (2016): 105-115.
Deng et al., "Carbon nanotube transistor circuits: Circuit-level performance benchmarking and design options for iving with imperfections." Solid-State Circuits Conference, 2007. ISSCC 2007. Digest of Technical Papers. IEEE International. IEEE, 2007. 3 pages.
Desai et al., "MoS2 transistors with 1-nanometer gate lengths." Science 354.6308 (2016): 99-102.
Ding et al., "CMOS-based carbon nanotube pass-transistor logic integrated circuits." Nature communications 3.1 (2012): 1-7.
Ding et al., "Y-contacted high-performance n-type single-walled carbon nanotube field-effect transistors: scaling and comparison with Sc-contacted devices." Nano letters 9.12 (2009): 4209-4214.
Franklin et al., "Carbon nanotube complementary wrap-gate transistors." Nano letters 13.6 (2013): 2490-2495.
Franklin et al., "Scalable and fully self-aligned n-type carbon nanotube transistors with gate-all-around." Electron Devices Meeting (IEDM), 2012 IEEE International. IEEE, 2012. 4 pages.
Franklin et al., "Sub-10 nm carbon nanotube transistor." Nano letters 12.2 (2012): 758-762.
Geier et al., "Controlled n-type doping of carbon nanotube transistors by an organorhodium dimer." Nano letters 16.7 (2016): 4329-4334.
Geier et al., "Solution-processed carbon nanotube thin-film complementary static random access memory." Nature nanotechnology 10.11 (2015): 944. 6 pages.
Geier et al., Subnanowatt Carbon Nanotube Complementary Logic Enabled by Threshold Voltage Control. Nano Lett. 2013, 13, 4810-4814.
Ha et al., Highly Uniform and Stable N-Type Carbon Nanotube Transistors by Using Positively Charged Silicon Nitride Thin Films. Nano Lett. 2015, 15, 392-397.
Hahn et al., "A scaled replacement metal gate InGaAs-on-Insulator n-FinFET on Si with record performance." Electron Devices Meeting (IEDM), 2017 IEEE International. IEEE, 2017. 4 pages.
Han et al., "High-speed logic integrated circuits with solution-processed self-assembled carbon nanotubes." Nature nanotechnology 12.9 (2017): 861. 7 pages.

Heinze et al., Carbon Nanotubes as Schottky Barrier Transistors. Phys. Rev. Lett. 2002, 89, 106801. 4 pages.
High Purity, Electronically Separated Nanomaterials. NanoIntegris. Accessed at http://nanointegris.com/ on Feb. 13, 2020. 8 pages.
Hills et al., "Rapid Co-Optimization of Processing and Circuit Design to Overcome Carbon Nanotube Variations " IEEE Trans. on CAD of Integrated Circuits and Systems 34.7 (2015): 1082-1095.
Hills et al., "TRIG: hardware accelerator for inference-based applications and experimental demonstration using carbon nanotube FETs." Proceedings of the 55th Annual Design Automation Conference. 2018. 10 pages.
Hills et al., "Understanding energy efficiency benefits of carbon nanotube field-effect transistors for digital VLSI." IEEE Transactions on Nanotechnology 17.6 (2018): 1259-1269.
Hills et al., Modern microprocessor built from complementary carbon nanotube transistors. Nature 572.7771 (2019): 595-602.
International Search Report and Written Opinion in International Application No. PCT/US2019/050286 dated May 19, 2020, 16 pages.
International Search Report and Written Opinion in International Patent Application No. PCT/US19/15595 dated Apr. 19, 2019, 14 pages.
International Search Report and Written Opinion in International Patent Application No. PCT/US2019/036006 dated Oct. 16, 2019, 13 pages.
International Search Report and Written Opinion in International Patent Application No. PCT/US2019/052675 dated Jan. 14, 2020, 16 pages.
International Search Report and Written Opinion in International Patent Application No. PCT/US2019/063932 dated Feb. 19, 2020, 14 pages.
Javey et al., "Ballistic carbon nanotube field-effect transistors." nature 424.6949 (2003): 654-657.
Joo et al., Dose-Controlled, Floating Evaporative Self-Assembly and Alignment of Semiconducting Carbon Nanotubes from Organic Solvents. Langmuir 2014, 30, 3460-3466.
Kang et al., CMOS digital integrated circuits. Tata McGraw-Hill Education, 2003. 83 pages.
Khan et al., "Science and research policy at the end of Moore's law." Nature Electronics 1.1 (2018): 14-21.
Kuhn et al., The Ultimate CMOS Device and Beyond. In IEEE Int. Electron Devices Meet.; 2012; vol. 8.1.1?8.1. 4 pages.
Kuhn,. "Considerations for ultimate CMOS scaling." IEEE transactions on Electron Devices 59.7 (2012): 1813-1828.
La Tulipe et al., "Upside-down FETs." SOI Conference, 2008. SOI. IEEE International. IEEE, 2008. 2 pages.
Lau et al., "Tunable n-type doping of carbon nanotubes through engineered atomic layer deposition HfOX films." ACS nano 12.11 (2018): 10924-10931.
Lee et al., "A compact virtual-source model for carbon nanotube FETs in the sub-10-nm regime—Part I: Intrinsic elements." IEEE transactions on electron devices 62.9 (2015): 3061-3069.
Boots et al., "Identification of microorganisms based on headspace analysis of volatile organic compounds by gas chromatography-mass spectrometry." Journal of breath research 8.2 (2014): 027106. 13 pages.
Bos et al., "The volatile metabolic fingerprint of ventilator-associated pneumonia." Intensive Care Medicine 40.5 (2014): 761-762.
Bos et al., "Volatile metabolites of pathogens: a systematic review." PLoS pathog 9.5 (2013): e1003311. 8 pages.
Cook, "Ventilator associated pneumonia: perspectives on the burden of illness." Intensive Care Medicine 26.1 (2000): S031-S037.
Design Compiler Graphical. Synopsys, Inc. Accessed at https://www.synopsys.com/implementation-and-signoff/rtl-synthesis-test/design-compiler-graphical.html on Mar. 2, 2021. 6 pages.
Farmer et al., "Atomic layer deposition on suspended single-walled carbon nanotubes via gas-phase noncovalent functionalization." Nano Letters 6.4 (2006): 699-703.
Filipiak et al., "Molecular analysis of volatile metabolites released specifically by *Staphylococcus aureus* and *Pseudomonas aeruginosa*." BMC Microbiology 12.1 (2012): 1-16.

(56) References Cited

OTHER PUBLICATIONS

Fowler et al., "Critical care capacity in Canada: results of a national cross-sectional study." Critical Care 19.1 (2015): 1-8.
Fowler et al., "Surveillance for lower airway pathogens in mechanically ventilated patients by metabolomic analysis of exhaled breath: a case-control study " Thorax 70.4 (2015): 320-325.
Gouma et al., "Novel isoprene sensor for a flu virus breath monitor." Sensors 17.1 (2017): 199. 7 pages.
Humphreys et al., "Electronic nose analysis of bronchoalveolar lavage fluid." European Journal of Clinical nvestigation 41.1 (2011): 52-58.
IC Compiler II. Synopsys, Inc. Accessed at https://www.synopsys.com/implementation-and-signoff/physical-implementation/ic-compiler.html on Mar. 2, 2021. 6 pages.
Kalil et al., "Executive summary: management of adults with hospital-acquired and ventilator-associated pneumonia 2016 clinical practice guidelines by the Infectious Diseases Society of America and the American Thoracic Society." Clinical Infectious Diseases 63.5 (2016): 575-582.
Kalil et al., "Management of adults with hospital-acquired and ventilator-associated pneumonia: 2016 clinical practice guidelines by the Infectious Diseases Society of America and the American Thoracic Society." Clinical Infectious Diseases 63.5 (2016): e61-e111.
Kim et al., "Atomic layer deposited $Al_2O_3$ for gate dielectric and passivation layer of single-walled carbon nanotube transistors." Applied Physics Letters 90.16 (2007): 163108. 4 pages.
Koenig et al., "Ventilator-associated pneumonia: diagnosis, treatment, and prevention." Clinical Microbiology Reviews 19.4 (2006): 637-657.
Kollef et al., "Economic impact of ventilator-associated pneumonia in a large matched cohort." (2012). 9 pages.
Kuti et al., "Impact of inappropriate antibiotic therapy on mortality in patients with ventilator-associated pneumonia and blood stream infection: a meta-analysis." Journal of Critical Care 23.1 (2008): 91-100.
Library Design. Silvaco, Inc. Accessed at https://silvaco.com/services/library-design/ on Mar. 2, 2021. 4 pages.
Machado et al., "Cost-effectiveness of linezolid versus vancomycin in mechanical ventilation-associated nosocomial pneumonia caused by methicillin-resistant *Staphylococcus aureus*." Brazilian Journal of Infectious Diseases 9.3 (2005): 191-200.
Melsen et al., "Attributable mortality of ventilator-associated pneumonia: a meta-analysis of individual patient data from randomised prevention studies." The Lancet Infectious Diseases 13.8 (2013): 665-671.
Muscedere et al., "Mortality, attributable mortality, and clinical events as end points for clinical trials of ventilator-associated pneumonia and hospital-acquired pneumonia." Clinical Infectious Diseases 51.Supplement_1 (2010): S120-S125.
Nakhleh et al., "Diagnosis and classification of 17 diseases from 1404 subjects via pattern analysis of exhaled molecules." ACS Nano 11.1 (2017): 112-125.
Patil et al., "Wafer-scale growth and transfer of aligned single-walled carbon nanotubes." IEEE Transactions on Nanotechnology 8.4 (2009): 498-504.
Phillips et al., "Variation in volatile organic compounds in the breath of normal humans." Journal of Chromatography B: Biomedical Sciences and Applications 729.1-2 (1999): 75-88.
PrimeTime Static Timing Analysis. Synopsys, Inc. Accessed at https://www.synopsys.com/implementation-and-signoff/signoff/primetime.html on Mar. 2, 2021. 7 pages.
Rana et al., "A review on recent advances of CNTs as gas sensors." Sensor Review (2017). 12 pages.
Safdar et al.,"The pathogenesis of ventilator-associated pneumonia: its relevance to developing effective strategies tor prevention." Respiratory Care 50.6 (2005): 725-741.
Schnabel et al., "Electronic nose analysis of exhaled breath to diagnose ventilator-associated oneumonia." Respiratory Medicine 109.11 (2015): 1454-1459.
Sentaurus Device. Synopsys, Inc.. Accessed at https://www.synopsys.com/silicon/tcad/device-simulation/sentaurus-device.html on Mar. 2, 2021. 3 pages.
Spectre Simulation Platform. Cadence Design Systems, Inc. Accessed at https://www.cadence.com/en_US/home/tools/custom-ic-analog-rf-design/circuit-simulation/spectre-simulation-platform.html on Mar. 2, 2021. 3 pages.
Tcad—Raphael. Synopsys, Inc. Accessed at https://www.synopsys.com/silicon/tcad/interconnect-simulation/raphael.html on Mar. 2, 2021. 4 pages.
Tracer—Electron scattering and process effects quantified. GenISys GmbH 2017. Accessed at https://www.genisys-gmbh.com/tracer.html on Mar. 2, 2021. 6 pages.
TruNarc. HazmatLINK. Accessed at http://www.hazmatlink.com/trunarc.html on Mar. 2, 2021. 2 pages.
Understand, Predict, and Optimize Physics-Based Designs and Processes with COMSOL Multiphysics®. COMSOL Multiphysics®. Accessed at https://www.comsol.com/comsol-multiphysics on Mar. 2, 2021. 16 pages.
Venkatachalam et al., "The diagnostic dilemma of ventilator-associated pneumonia in critically ill children." Pediatric Critical Care Medicine 12.3 (2011): 286-296.
Wang et al., "National trends in patient safety for four common conditions, 2005-2011." New England Journal of Medicine 370 (2014): 341-351.
Wong et al., "Memory leads the way to better computing." Nature Nanotechnology 10.3 (2015): 191-194.
Ebrahimi et al., "Monolithic 3D integration advances and challenges: From technology to system levels." 2014 SOI-3D-Subthreshold Microelectronics Technology Unified Conference (S3S). IEEE, 2014. 2 pages.
Extended European Search Report in European Patent Application No. 19814933.8 dated Dec. 23, 2021, 8 pages.

\* cited by examiner

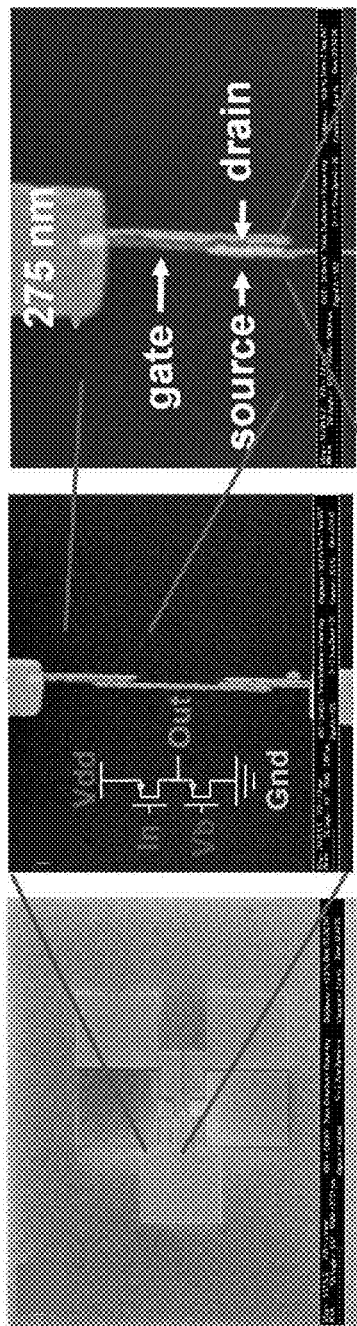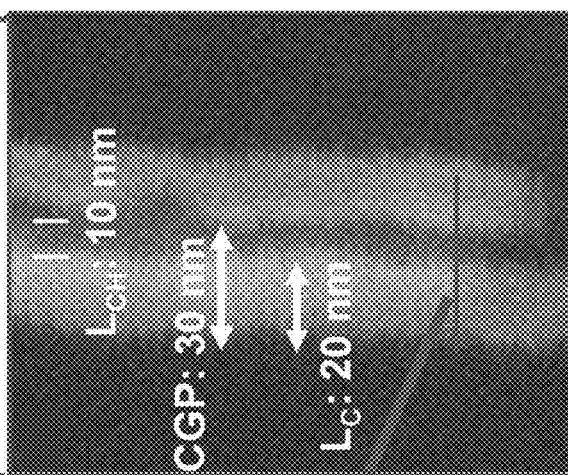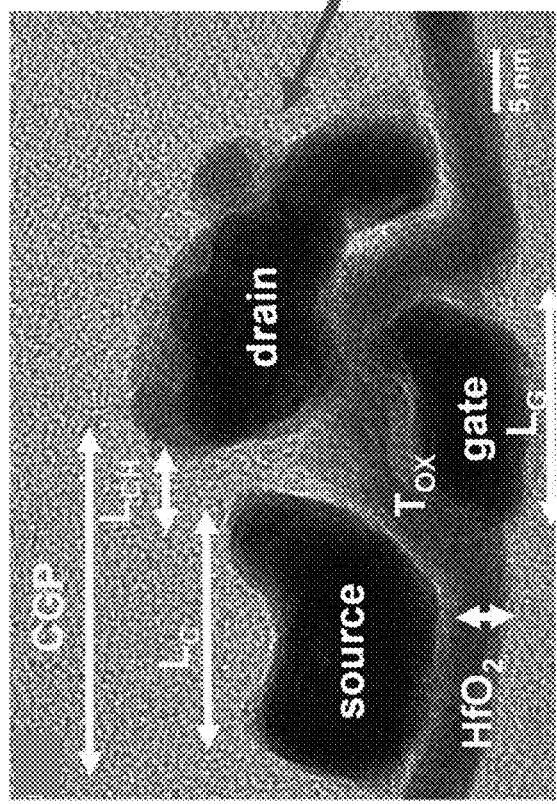
FIG. 5A  FIG. 5B  FIG. 5C  FIG. 5D  FIG. 5E

| CGP (nm) | 30 | 42 | 90 | 180 |
|---|---|---|---|---|
| $L_G$ (nm) | 9 | 9 | 24 | 45 |
| $L_{SP}$ (nm) | 6 | 12 | 20 | 45 |
| $L_C$ (nm) | 9 | 9 | 26 | 45 |
| $H_G$ (nm) | 20 | 30 | 40 | 90 |
| $H_C$ (nm) | 40 | 60 | 80 | 180 |
| $T_{OX}$ (nm) | 2 | 2 | 3 | 4 |
| $K_{SPACER}$ | 5.5 | 5.5 | 5.5 | 5.5 |
| $K_{OX}$ | 10.3 | 10.3 | 10.3 | 10.3 |

FIG. 8B

| CGP (nm) | 15 | 15 | 15 | 15 |
|---|---|---|---|---|
| $L_G$ (nm) | 9 | 12 | 16 | 5 |
| $L_{SP}$ (nm) | -1.5 | -3 | -5 | +2 |
| $L_C$ (nm) | 9 | 9 | 9 | 6 |
| $H_G$ (nm) | 15 | 15 | 15 | 15 |
| $H_C$ (nm) | 30 | 30 | 30 | 30 |
| $T_{OX}$ (nm) | 2 | 2 | 2 | 2 |
| $K_{SPACER}$ | 5.5 | 5.5 | 5.5 | 5.5 |
| $K_{OX}$ | 10.3 | 10.3 | 10.3 | 10.3 |

FIG. 13B

BACK-GATE FIELD-EFFECT TRANSISTORS AND METHODS FOR MAKING THE SAME

CROSS-REFERENCE TO RELATED PATENT APPLICATION

This application is a national-phase application, under 35 U.S.C. 371, to International Application No. PCT/US2019/015595, filed on Jan. 29, 2019, entitled "BACK-GATE FIELD-EFFECT TRANSISTORS AND METHODS FOR MAKING THE SAME," which in turn claims priority, under 35 U.S.C. § 119(e), to U.S. Application No. 62/623,277, filed on Jan. 29, 2018, entitled "BACK-GATE CARBON NANOTUBE FIELD-EFFECT TRANSISTORS", which is incorporated herein by reference in its entirety.

BACKGROUND

The development of progressively smaller transistor technology nodes has led to increasing technical and economical challenges. In particular, a roadmap towards scaling transistors beyond sub-3 nm technology nodes remains elusive given present manufacturing capabilities. For instance, if the contacted gate pitch (CGP) scales at its historical pace as dictated by Moore's Law, the shrinking of the physical spacing between the metal gate and the metal source/drain of the field effect transistor (FET) (i.e., the spacer thickness) results in increased parasitic capacitances, degrading potential energy delay product (EDP) benefits.

This is driving the search for beyond-silicon emerging nanotechnologies to supplement silicon CMOS. For instance, carbon nanotubes (CNTs) can be used to form carbon nanotube field effect transistors (CNFETs), whereby multiple CNTs in parallel comprise the channel of the FET with lithographically defined source, drain, and gate regions. It is projected that digital very-large-scale integrated (VLSI) circuits fabricated from CNFETs can achieve an order of magnitude improvement in EDP vs. silicon complementary metal oxide semiconductor (CMOS).

SUMMARY

The development of new transistor architectures that utilize nanomaterials as a substitute for silicon is one promising approach to scale transistors to progressively smaller technology nodes without increasing the EDP or raising costs of manufacture in an unsustainable manner. The present disclosure is thus directed to various back-gate field effect transistors (FET) and methods for making the back-gate FETs, which can be scaled down to sub-3 nm technology nodes with lower EDP than conventional top-gate and gate-all-around (GAA) FETs at the same CGP. The design architecture of the back-gate FETs described herein may be used to substantially reduce the CGP, which is a key metric defining the area of a FET and consequently the technology node. In one exemplary design, carbon nanotubes (CNTs) are used as the channel to form a back-gate carbon nanotube field effect transistor (CNFET) with a CGP of about 30 nm. Multiple CNFETs may then be assembled to form a CNFET digital logic circuit. Such CNFETs may (1) improve the energy efficiency (i.e., the energy delay product EDP) of digital VLSI circuits as well as provide an approach to scale CGP digital logic to smaller technology nodes (e.g., sub-3 nm technology nodes).

These CNFETs may take the form of a transistor comprising a channel, a source, a drain, and a gate. The channel has a first side and a second side opposite the first side, with the source disposed on the first side of the channel. The drain is disposed on the first side of the channel and spaced apart from the source by a physical channel length of less than about 10 nm. And the gate is disposed on the second side of the channel and has a gate length greater than the physical channel length. This transistor may have a contacted gate pitch of 30 nm or less and a parasitic capacitance of less than 0.1 femtofarads/micron.

Another inventive transistor also includes a channel, a source, a drain, and a gate. Again, the channel has a first side and a second side opposite the first side, with the source and the drain on the first side of the channel. The gate is disposed on the second side of the channel and overlaps with the source, the drain, or both the source and the drain. This transistor has a contacted gate pitch of 30 nm or less.

In these transistors, the channel may include a (carbon) nanotube in electrical communication with the source and the drain, in which case there may be a dielectric disposed between the gate and the nanotube. The gate may overlap with the source, the drain, or the source and the drain. And the transistor may be configured to operate at a clock frequency ranging between about 0.1 GHz and about 10 GHz.

These transistors can be made by forming a gate, depositing a dielectric on the gate, depositing a carbon nanotube over the dielectric to form a channel, and patterning a source and a drain on the channel opposite the gate with a physical channel length less than a length of the gate and less than about 10 nm. Depositing the carbon nanotube may occur at a temperature of less than about 400° C. Patterning the source and the drain may involve lithographically etching with physical channel length at a minimum feature size and/or overlapping the source, the drain, or both the source and the drain with the gate. Before forming the gate, a trench may be patterned into a substrate such that the gate, when formed, is embedded in the substrate.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. Terminology explicitly employed herein that also may appear in any disclosure incorporated by reference should be accorded a meaning most consistent with the particular concepts disclosed herein.

BRIEF DESCRIPTION OF DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 5A shows a top view of a probe pad layout for a CNFET digital logic (inverter).

FIG. 5B shows a magnified view of a typical CNFET inverter. Note the image shows an inverter before the pads in FIG. 4 are deposited, since the pads cover some of these features.

FIG. 5C shows a magnified view of a typical 30 nm CGP back-gate CNFET in the CNFET inverter shown in FIG. 5B.

FIG. 5D shows a magnified view of the CNFET channel region. The contact length, $L_C$, is 20 nm and the physical channel length, $L_CH$, is 10 nm, resulting in a 30 nm CGP. The gate length, $L_G$, is 18 nm, and overlaps both with the source (left contact) and drain (right contact) by ~4 nm.

FIG. 5E shows a cross-sectional transmission electron microscopy image of a back-gate CNFET with nominal 30 nm CGP.

FIG. 8B shows a table of the device parameters used for analysis. CGP values of 30 nm, 42 nm, 90 nm, and 180 nm correspond to 3 nm, 7 nm, 22 nm, and 45 nm technology nodes, respectively.

FIG. 10 shows values extracted from these EDP trade-off curves.

FIG. 13B shows a table with device parameters used for extracting capacitances in FIG. 13A.

DETAILED DESCRIPTION

Figure 1A:
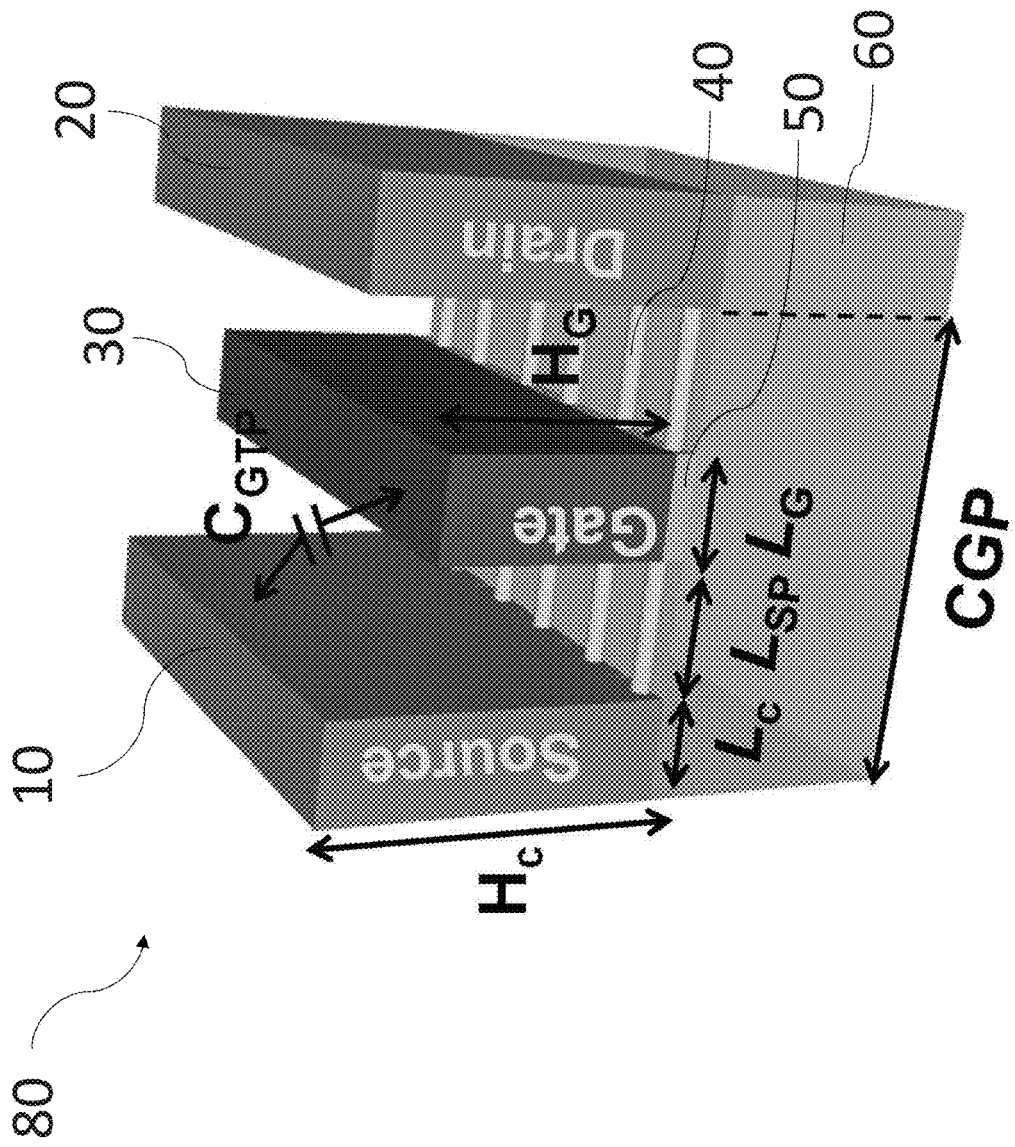
FIG. 1A shows a FET with a top-gate FET geometry.

FIG. 1A shows a schematic of a top-gate CNFET 80. The top-gate CNFET 80 includes a channel 40. A source 10 and a drain 20 are disposed on a first side of the channel 40 such that electric current flows from the source 10 to the drain 20 through the channel 40. A gate 30 disposed on the first side of the channel 40 between the source 10 and the drain 20 controls the flow of current through the channel 40. A dielectric 50 may be disposed between the gate 30 and the channel 40. A substrate 60 may provide mechanical support for manufacture and handling.

Figure 1B:
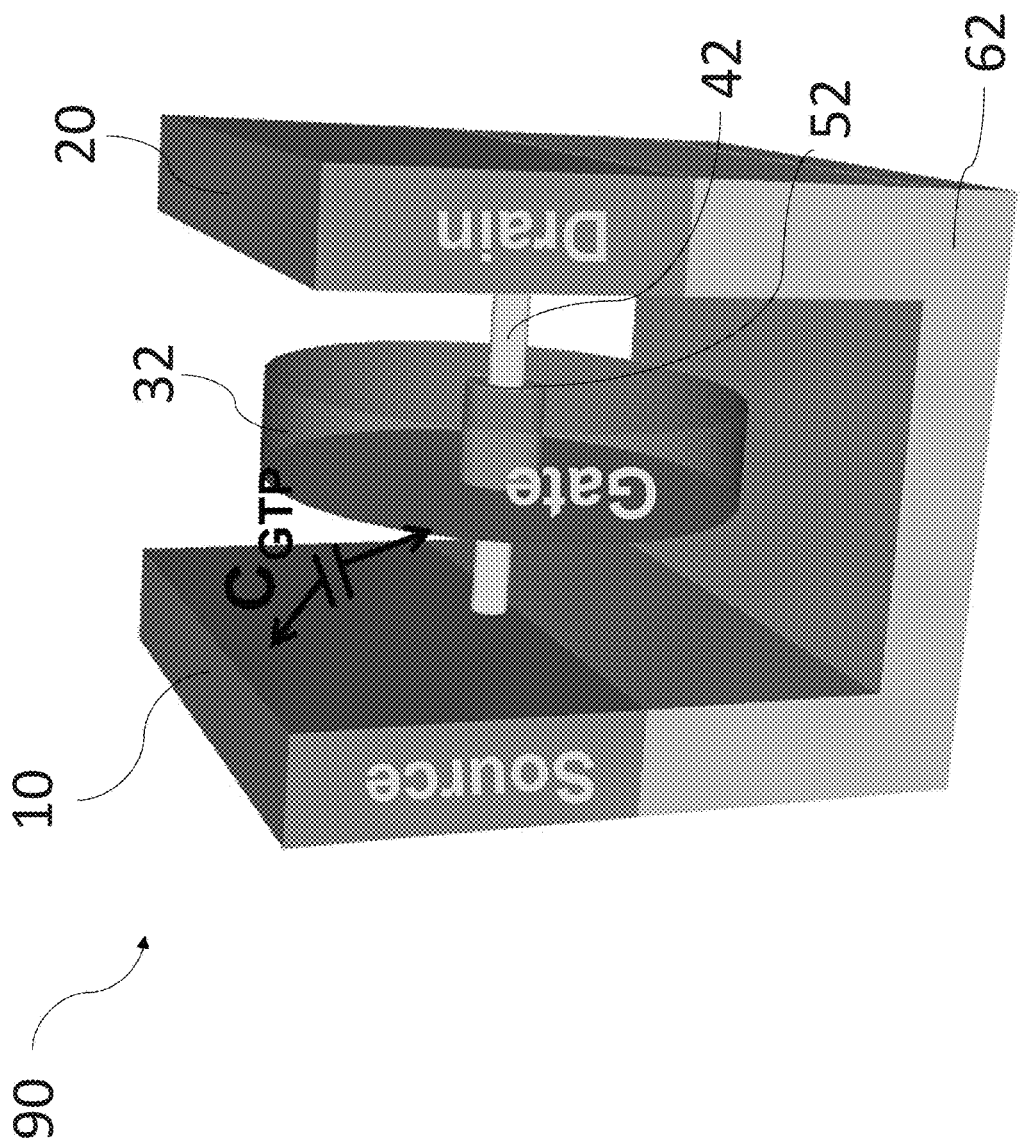
FIG. 1B shows a FET with a gate-all-around FET geometry.

FIG. 1B shows a schematic of a gate-all-around (GAA) CNFET 90. Similar to the top-gate CNFET 80, the GAA CNFET 90 includes a source 10, a drain 20, and a channel 42 disposed on a first side of the channel 42. In this case, a gate 32 surrounds the channel 42 on all sides. As shown in FIG. 1B, the gate 32 is between the source 10 and the drain 20. A dielectric 52 may also be disposed between the channel 40 and the gate 30. Once again, a substrate 62 may provide mechanical support for manufacture and handling.

Generally, the size of the transistor and, hence, the corresponding technology node may be quantified using a contacted gate pitch (CGP). The CGP may be defined as equal to the gate pitch between two FETs 100 connected in series with a shared source 110/drain 120 contact. For the top-gate CNFET 80 and the GAA CNFET 90, the CGP is thus equal to the sum of the source 110/drain 120 contact length ($L_C$), the physical gate length ($L_G$) of the gate 130, and the two spacer regions ($2L_{SP}$) that separate the gate 130 from the source 110/drain 120:

$$CGP = L_C + L_G + 2L_{SP} \quad (1)$$

This CGP is illustrated in FIG. 1A.

A physical channel length ($L_{CH}$), may also be defined using the above parameters as follows, $$L_{CH} = CGP - L_C \quad (2)$$

Figure 2A:
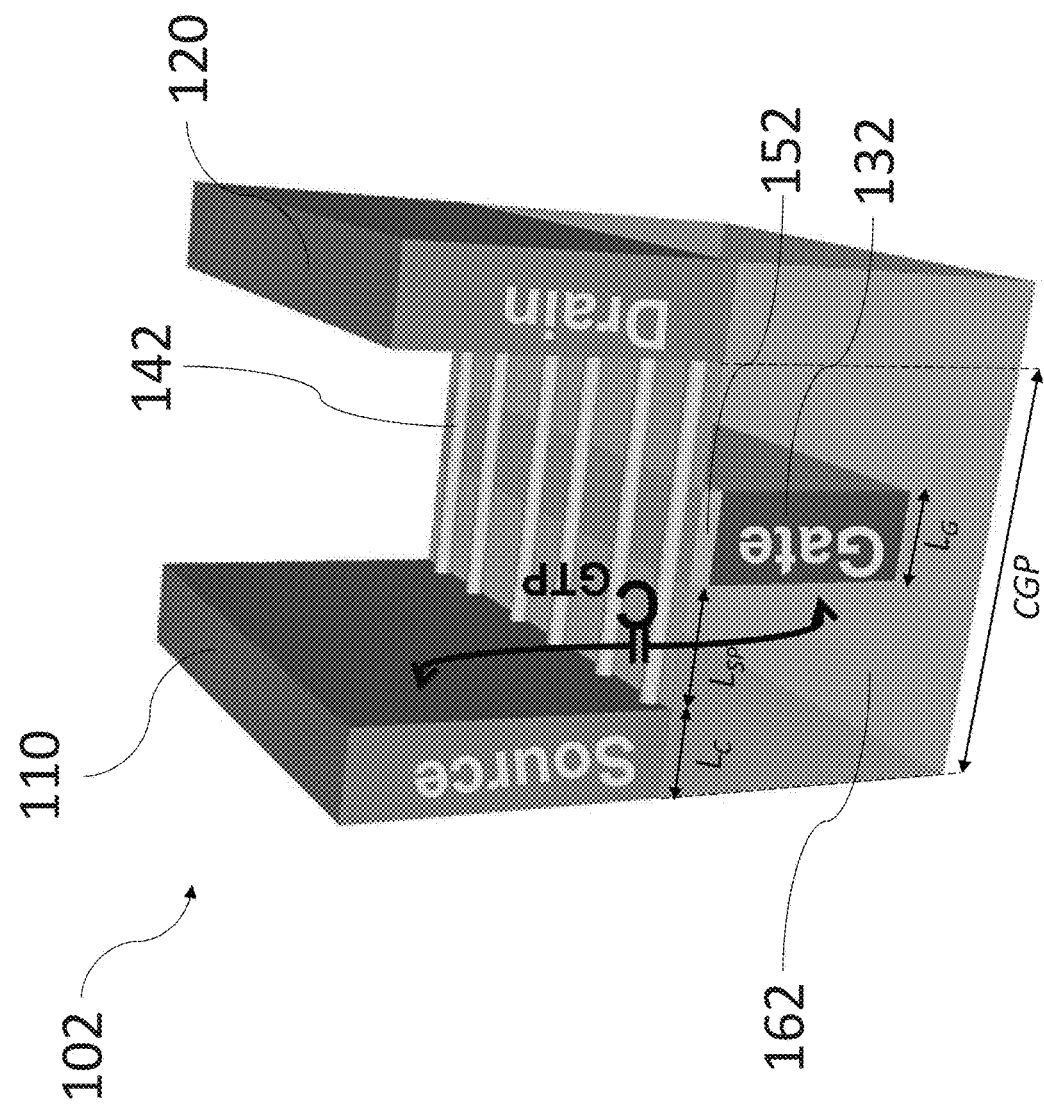
FIG. 2A shows an exemplary FET where CNTs are used as the FET channel in a back-gate FET geometry with a negative spacer length, $L_{SP}$.
Figure 2B:
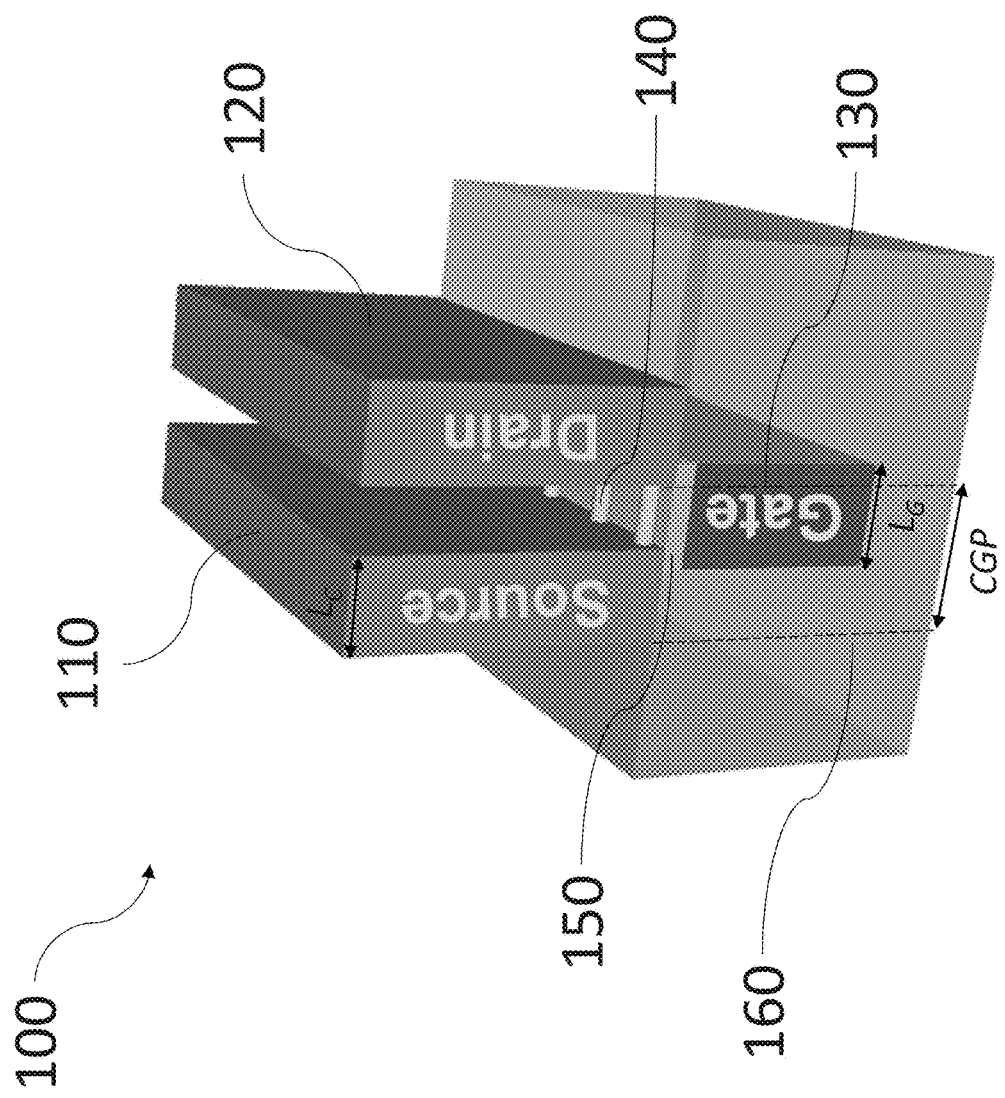
FIG. 2B shows an exemplary FET where CNTs are used as the FET channel in a back-gate FET geometry.

For comparison, FIGS. 2A and 2B show a schematic of an exemplary back-gate CNFET 100. CNFETs have previously used both a back-gate FET geometry and sophisticated FET geometries (such as GAA CNFETs). However, a rigorous analysis of the relative benefits (e.g., both energy efficiency and area scaling) of these sophisticated geometries compared to back-gate FET geometries was not performed. Here, back-gate FET geometries are shown to provide several benefits that have not been exploited for highly scaled technologies. For example, back-gate FETs enable physical scaling beyond the limits of both top-gate and gate-all-around FET geometries. Back-gate FETs also provide additional EDP benefits owing to a reduction in parasitic capacitances compared to top-gate and GAA FETs.

The back-gate CNFET 102 in FIG. 2A includes a channel 142 that allows electric current to flow from a source 110 to a drain 120. As shown, the source 110 and the drain 120 may be disposed on a first side of the channel 142. The back-gate FET 100 also includes a gate 132 to control the flow of current with application of a voltage. The gate 132 may be disposed on a second side of the channel 142 opposite to the first side of the channel 142, hence the back-gate geometry. The gate 132 may be embedded in a substrate 162 that supports the back-gate FET 100. A dielectric 152 may also be disposed between the gate 132 and the channel 142.

Compared to the top-gate CNFET 80 and the GAA CNFET 90, the back-gate CNFET 102 in FIG. 2A can support a shorter CGP to enable more highly-scaled technology nodes. For instance, the spacer regions, which are used to avoid unwanted electrical contact (electrical shorts) between the gate 132 and the source 110/drain 120 are not necessary for the back-gate FET 100 since the back-gate 132 is on a plane beneath the source 110/drain 120. Therefore, the spacer regions may be eliminated entirely, thus enabling a smaller CGP and a physical channel length, $L_{CH}$, in transistors that would otherwise be constrained by design and/or fabrication limitations. For example, foundries typically impose a minimum feature size for a device layer as defined by the foundry's process development kit, which constrains conventional top-gate FETs and GAA FETs due to the need for the aforementioned spacer regions. And lithographical processes have resolution limitations that constrain the dimensions and relative spacing between features in the transistor. In both examples, the removal of the spacer regions allows the source 110 and the drain 120 to be positioned more closely resulting in a smaller $L_{CH}$.

For the back-gate FET 102, parasitic capacitances between the gate 132 and the source 110 and the gate 132 and the drain 120 may also be reduced, in part, by the reduced electrical coupling between the gate 132 and the source 110/drain 120 in the back-gate architecture. For example, the back-gate FET 100 may exhibit a total parasitic capacitance (gate-to-plug capacitance) less than about 0.1 femtofarads/micron.

Some back-gate CNFETs, including the back-gate CNFET 100 shown FIG. 2B, have a gate 130 that partially overlaps with the source 110 and/or the drain 120 while maintaining parasitic capacitances less than a corresponding top-gate or GAA FET at the same CGP. For designs having an overlap, a channel 140 and/or a dielectric 150 may be used to separate the gate 130 from the source 110/drain 120. This overlapping gate 130 may be supported by or embedded in a substrate 160, e.g., for mechanical stability and support.

FIG. 2B shows an exemplary back-gate FET 100 with an overlap between the gate 130 and the source 110/drain 120. Such an overlap corresponds to a spacer length $L_{SP}<0$ in Eq. 1. In this manner, the CGP can be reduced by decreasing $L_{SP}$ (e.g., below zero)—even without improving fabrication techniques to scale $L_C$ and $L_G$ to smaller dimensions.

In general, the back-gate FET 100 in FIG. 2B may have a CGP less than about 30 nm. The back-gate FET 100 may also have a $L_{CH}$ less than about 10 nm. The CGP and $L_{CH}$ may vary by +/−1-5 nm due, in part, to variability and tolerances in fabrication. An overlap between the gate 130 and the source 110/drain 120 may be used to enable such reductions in CGP and $L_{CH}$, particularly given present limitations in fabrication. Future improvements in fabrication processes may also enable reductions in CGP and $L_{CH}$ without an overlap between the gate 130 and the source 110/drain 120.

As described below, the manufacture of the back-gate FET 100 may involve modifications to the process flow conventionally used for top-gate FETs or GAA FETs due, in part, to temperature considerations and material compatibility. Such modifications may include use of different materials/structures for the channel 140. For example, the channel 140 may be formed of one or more CNTs, which may be deposited at temperatures below 400° C. to avoid damaging the gate 130. As shown in FIG. 2B, several CNTs may be used as the channel 140 in order to support a higher electric current.

The dielectric 150 may be formed from various high-K dielectrics including, but not limited to, silicon oxide, hafnium oxide, or any other dielectrics known to one of ordinary skill in the art. The source 110 and the drain 120 may be formed from various electrical conducting materials including, but not limited to, platinum, titanium, tungsten, tantalum, copper, any alloys of the foregoing, or any electrical conductors known to one of ordinary skill in the art. The substrate 160 may be in the form of wafer formed from various materials including, but not limited to, silicon, silicon oxide, aluminum nitride, or any other semiconductor or insulating materials known to one of ordinary skill in the art.

Figure 3:
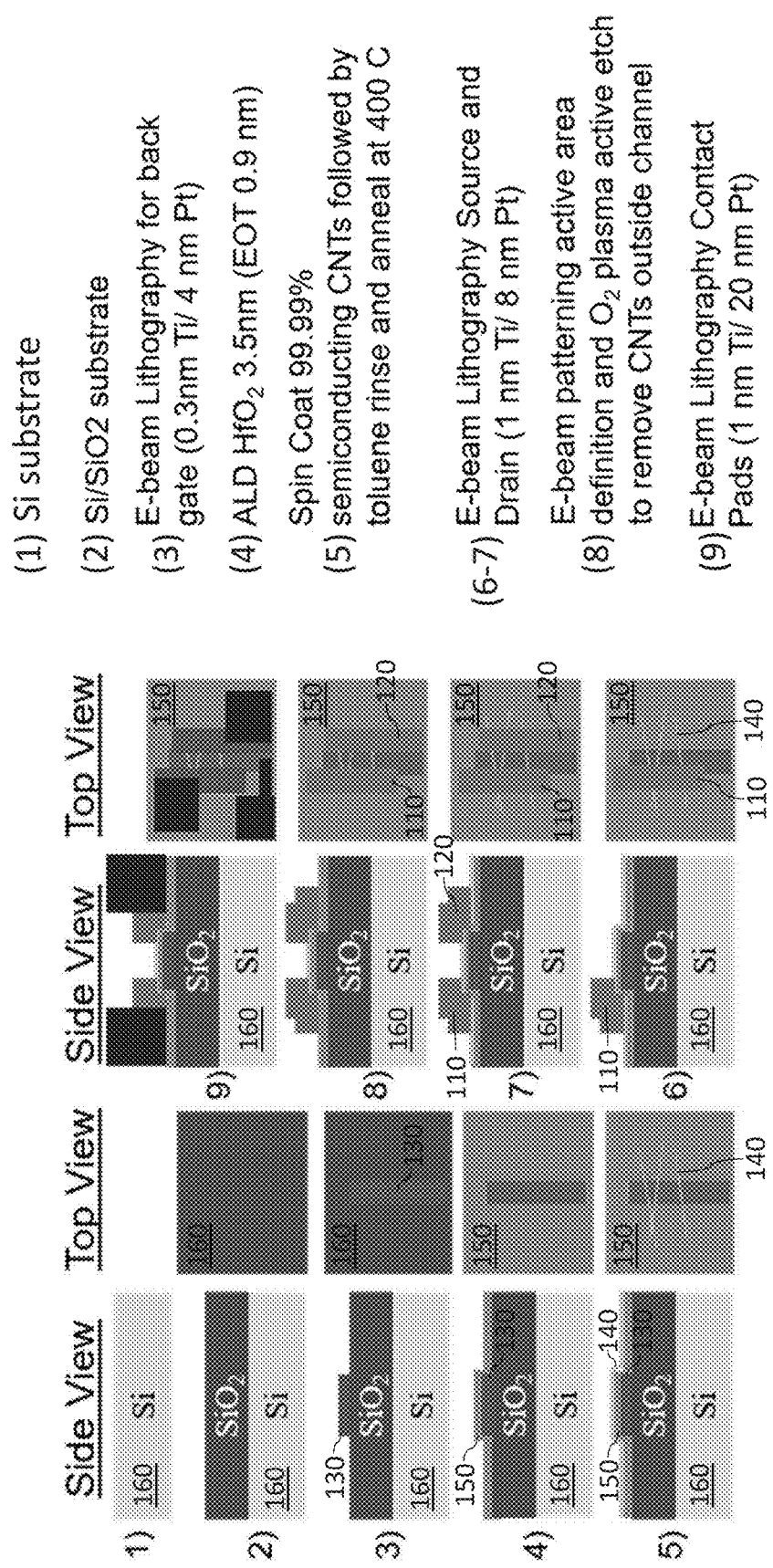
FIG. 3 shows a process flow diagram of a back-gate CNFET. While back-gates are not embedded within the substrate, a conventional damascene process may be used to reduce parasitics for back-gate FET geometries. E-beam photoresist thickness (<40 nm) limits the metal thickness in this experimental demonstration to <10 nm.
Figure 4:
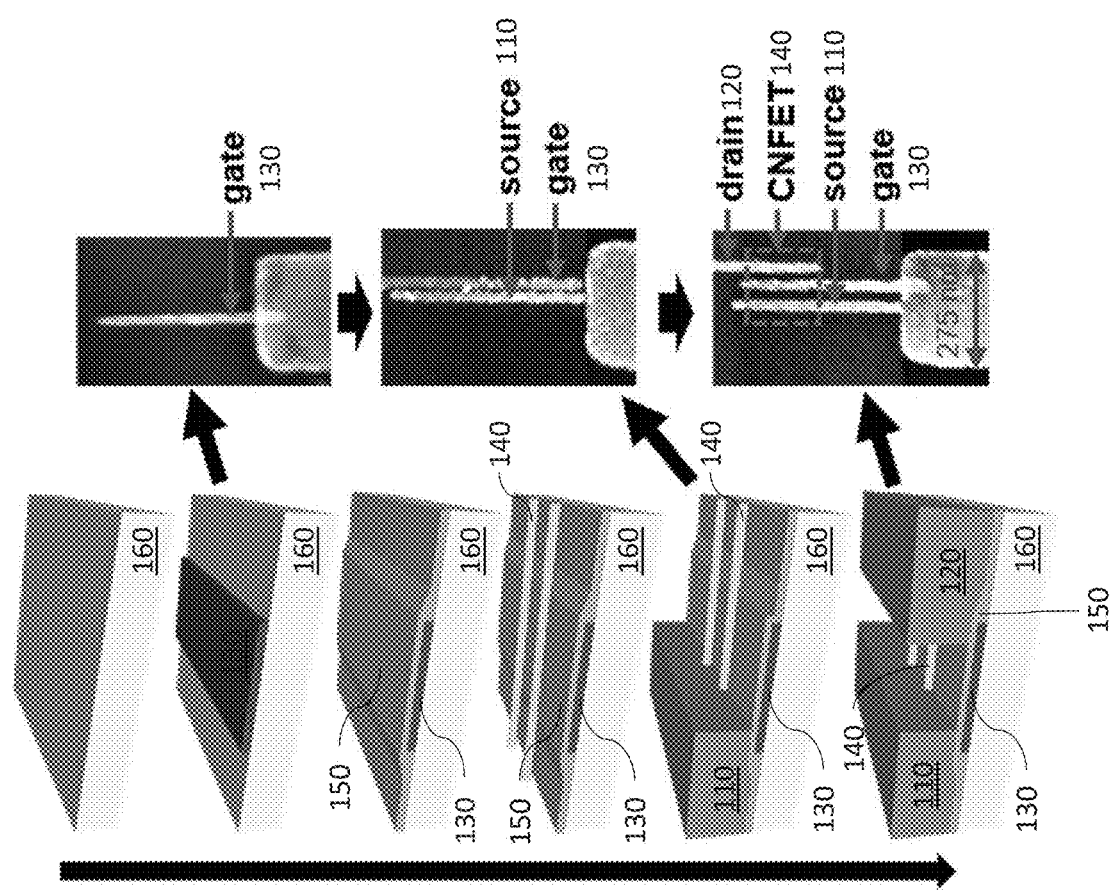
FIG. 4 shows three-dimensional schematics of the back-gate CNFET based on the process flow diagram of FIG. 3 with corresponding scanning electron microscopy(SEM) images of the back-gate CNFET.

CNFETS & CNFET Digital Logic with a Back-Gate Geometry Having a CGP Less than 30 nm The realization of the scaling benefits enabled by the back-gate FET 100 may involve some modifications to the front-end-of-line (FEOL) FET fabrication for conventional silicon-based technologies. As illustrated in FIGS. 3 and 4, the FET gate stack (e.g., gate 132 in FIG. 2A or gate 130 in FIG. 2B) is initially fabricated on the substrate. Subsequently, the semiconducting channel 140 of the FET 100 is deposited over this gate stack 130. To avoid damaging the gate stack 130 (e.g., by crystallizing the high-k gate dielectric 150 or destroying the embedded metal gate 130), the channel 140 deposition—and all subsequent FEOL processing—should preferably be performed at low temperatures (e.g., <400° C.). This may be particularly challenging for silicon-based technologies, which use processing temperatures >1000° C. In contrast, many emerging nanotechnologies use low processing temperatures (<400° C.), and thus naturally enable back-gate FET geometries. As a demonstration, CNTs may be used because CNTs may be deposited above the gate stack 130 at room temperature (e.g., through solution-based processing or a transfer process). Additionally, CNFETs may also improve the EDP for digital VLSI circuits by an order of magnitude compared to silicon FETs.

Fabrication

As an exemplary experimental demonstration, back-gate CNFETs 100 and CNFET digital logic were fabricated that exhibit a record scaled CGP of 30 nm. The fabrication flow for a back-gate CNFET 100 is shown in FIG. 3 and described as follows: (1) the starting substrate for the 30 nm CGP CNFETs 100 is a silicon substrate, (2) the silicon substrate is coated with a 800 nm thermal oxide, and (3) the gate 130 is patterned on the wafer 160 by first coating the wafer 160 with a single layer of PMMA positive resist (~45 nm PMMA A1). Electron-beam (e-beam) lithography is used to define the gate electrode ($L_G$~18 nm). PMMA is then developed at −3.5° C. forming the pattern. Electron beam (e-beam) evaporation is used to deposit 3 Å of titanium followed by 4 nm of platinum. A lift-off process is then performed. The preferred area dose for e-beam lithography is chosen, in part, by simulating the electron back-scattering effects in a stack of PMMA-$SiO_2$ and PMMA-$HfO_2$ in TRACER. This is followed by (4) deposition of a 3.5 nm thick $HfO_2$ dielectric 150 having an equivalent oxide thickness (EOT) of 0.9 nm using atomic layer deposition.

While the back-gates 130 are not embedded within the substrate 160, a conventional damascene process may be used to realize an embedded gate stack 130 in order to achieve the reduced parasitics afforded by back-gate FET geometries. For example, the substrate 160 may initially be patterned and etched to form a trench or recess along the surface of the substrate 160. Subsequent deposition of the materials used in the gate 130 (and the dielectric 150) may then fill the trench or recess in the substrate 160. A polishing process (e.g., chemical mechanical polishing) may then be used to remove excess gate material and/or to planarize the substrate 160 and gate 130 before subsequent fabrication processes are performed.

Following gate-stack 130 fabrication, PMMA and e-beam lithography are again used to pattern contact holes to the gate metal electrodes, and a dry $Cl_2$-based plasma etch is used to etch through the $HfO_2$. The PMMA is stripped in hot acetone followed by oxygen plasma. To prepare the wafer for CNT deposition, the surface is functionalized with hexamethyldisilazane (HMDS, a common photoresist adhesion promoter). The wafer 160 is then submerged in a solution of 1,2-dichloroethane (DCE) containing >99.9% pure semiconducting CNTs (modified IsoNanotubes-S supplied by Nanointegris) for 10 minutes.

This is followed by (5) dispersing CNTs in DCE. The CNTs go through several sonication steps to wrap the CNTs in a polymer to disperse them within the DCE, followed by several ultracentrifugation steps to remove non-dispersed CNTs and excess polymer. Following CNT deposition, the wafer 160 is rinsed in hot toluene for 60 minutes, followed by vacuum annealing at <$10^{-5}$ Torr for >30 minutes.

Next, (6) the source 110 and (7) the drain 120 are defined and patterned similar to the gate electrode. The source 110 and the drain 120 are patterned in two separate steps in order to decrease the minimum resolution. (8) After deposition of the CNT channel 140, PMMA is patterned to cover the transistor channel regions 140, and oxygen plasma is used to remove excess CNTs (i.e., CNTs outside of the transistor channel region 140, and therefore not protected by the PMMA). This is followed by (9) an e-beam lithography step, e-beam evaporation, and lift-off to define larger probe pads and interconnect wires.

The fabrication process flow described above is one exemplary process that may be used to form back-gate CNFETs 100. The various processes, parameters, and materials used may be modified or removed depending on the design of the back-gate FET 100. Additional processing steps may also be introduced, such as additional patterning and etching steps for embedding the gate 130 into the substrate 160 as described above.

Experimental Results

Figure 6A:
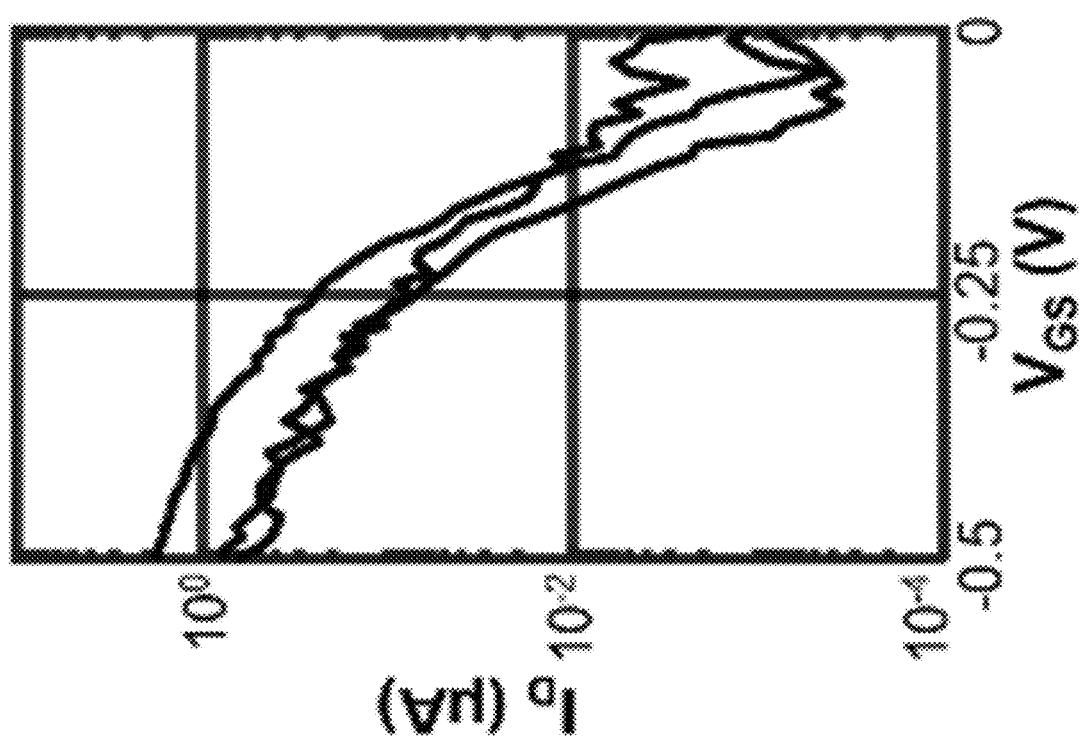
FIG. 6A shows the $I_D$-$V_{GS}$ characteristics of multiple 30 nm CGP CNFETs, achieving subthreshold-swings (SS) of ~125 mV/dec (at a drain-source voltage $V_{DS}$=−0.5V).
Figure 6B:
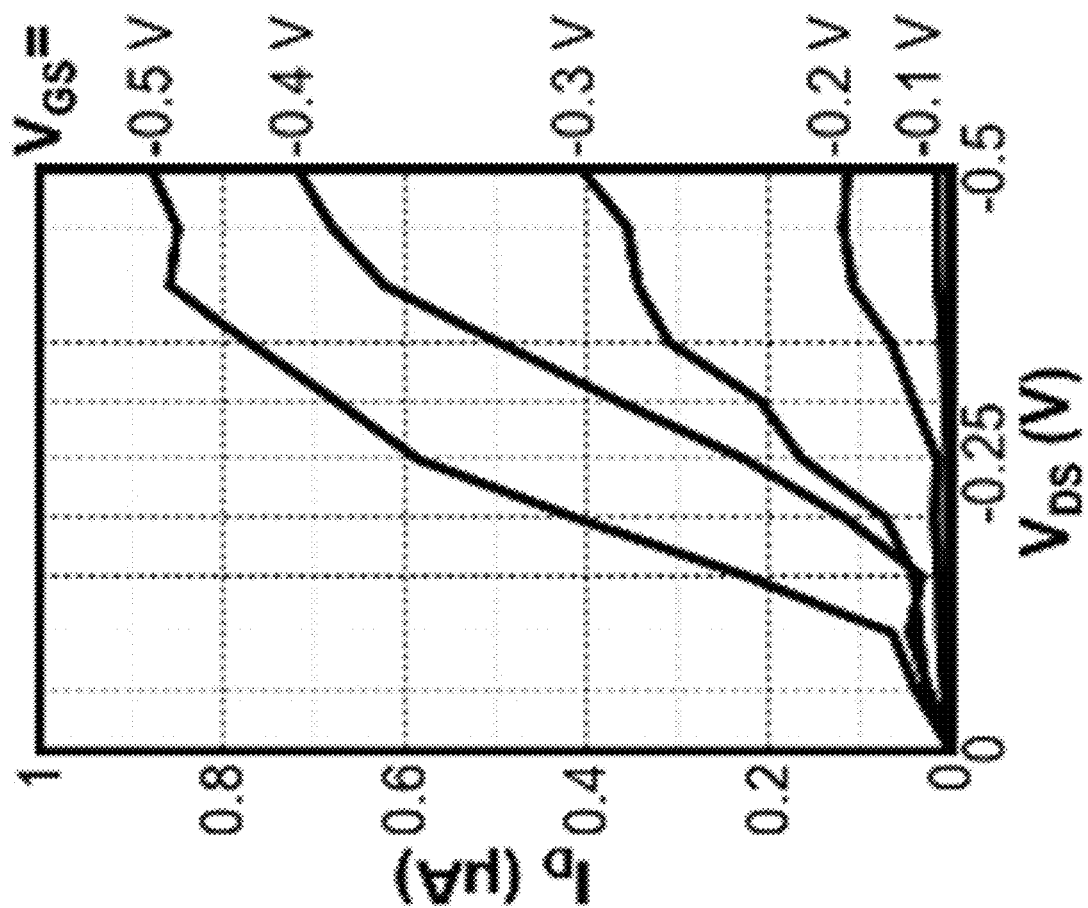
FIG. 6B shows the $I_D$-$V_{DS}$ characteristic of an exemplary 30 nm CGP CNFET.
Figure 6C:
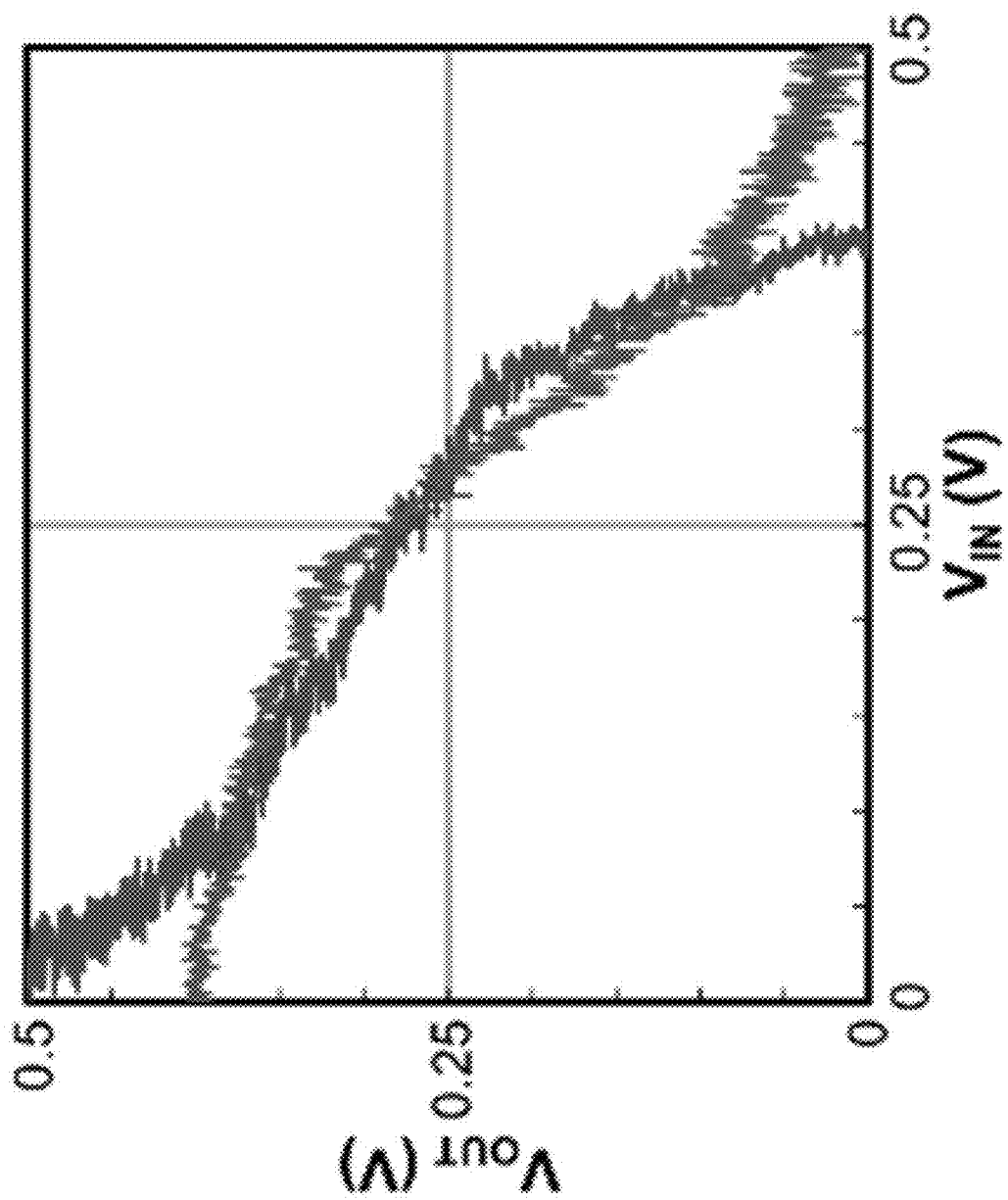
FIG. 6C shows the voltage transfer curve of a 30 nm CGP CNFET inverter, implemented using depletion load PMOS logic with an output high voltage $V_{OH}$=0.4V and an output low voltage $V_{OL}$=0.05V, respectively.
Figure 7:
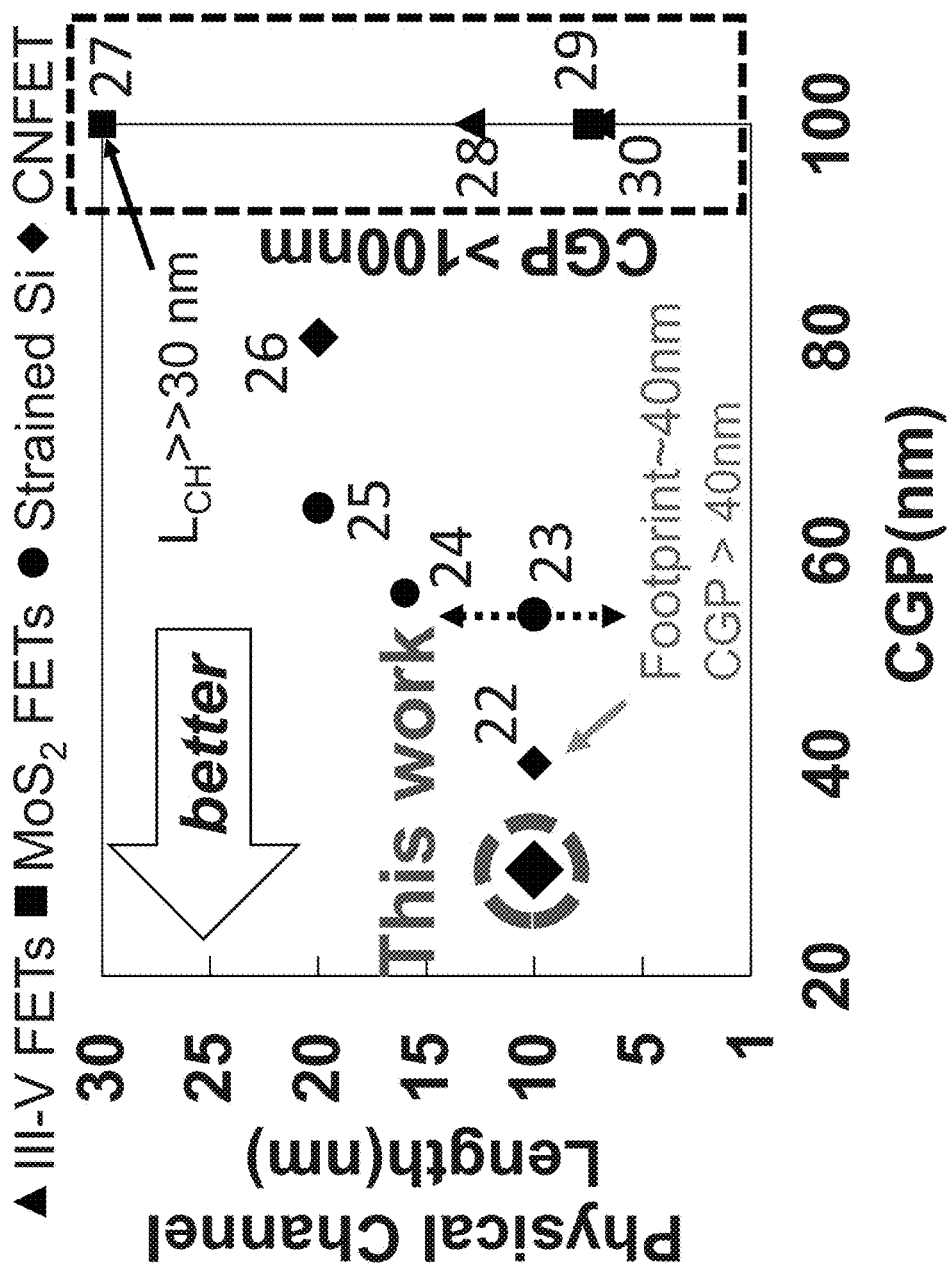
FIG. 7 shows a chart comparing the current work with respect to contacted gate pitch across best reported scaled technologies in the literature.

To achieve CNFETs 100 that fit within a CGP of 30 nm, the exemplary CNFETs 100 were patterned with $L_C$=20 nm, $L_G$=18 nm, $L_{SP}$=−4 nm (i.e., 4 nm intentional overlap of the back-gate 130 with the source 110 and the drain 120), with a physical channel length ($L_{CH}$=CGP−$L_C$) of 10 nm. Scanning electron microscopy (SEM) and transmission electron microscopy (TEM) images of the fabricated CNFETs 100 are shown in FIG. 5A-5E. Importantly, this scaled CGP is achieved without additional scaling of $L_G$ and $L_C$. This highlights how this approach can decouple the conflicting constraints on $L_C$ and $L_G$ (longer $L_C$ and $L_G$ can result in improved contact resistance and electrostatic control) from the constraints imposed by needing to aggressively scale CGP (ideally scaling both $L_C$ and $L_G$). FIGS. 6A-6C shows electrical characterization of a typical CNFET 100 and the measured voltage transfer curve from a CNFET inverter fabricated from 30 nm CGP CNFETs 100, illustrating functional operation.

VLSI System-Level Energy-Efficiency Benefits

In addition to the benefits that back-gate CNFETs 100 provide in terms of scaling, back-gate FET geometries may also simultaneously reduce parasitic capacitances (e.g., gate-to-source/drain capacitance (see gate-to-source/drain spacer capacitance: $C_{GTP}$ in FIG. 2A)), resulting in additional EDP benefits for digital very-large-scale integrated (VLSI) circuits. The reduced parasitic capacitances are due to the decreased electrical coupling between the gate 130 beneath the source 110 and drain 120 (i.e., considering the physical separation and overlap area between the gate 130 and the source 110 and/or the drain 120; see FIGS. 2A and 2B). In contrast, the gate is located directly between the source and drain for top-gate and GAA geometries forming large "parallel plate" capacitors.

Figure 8A:
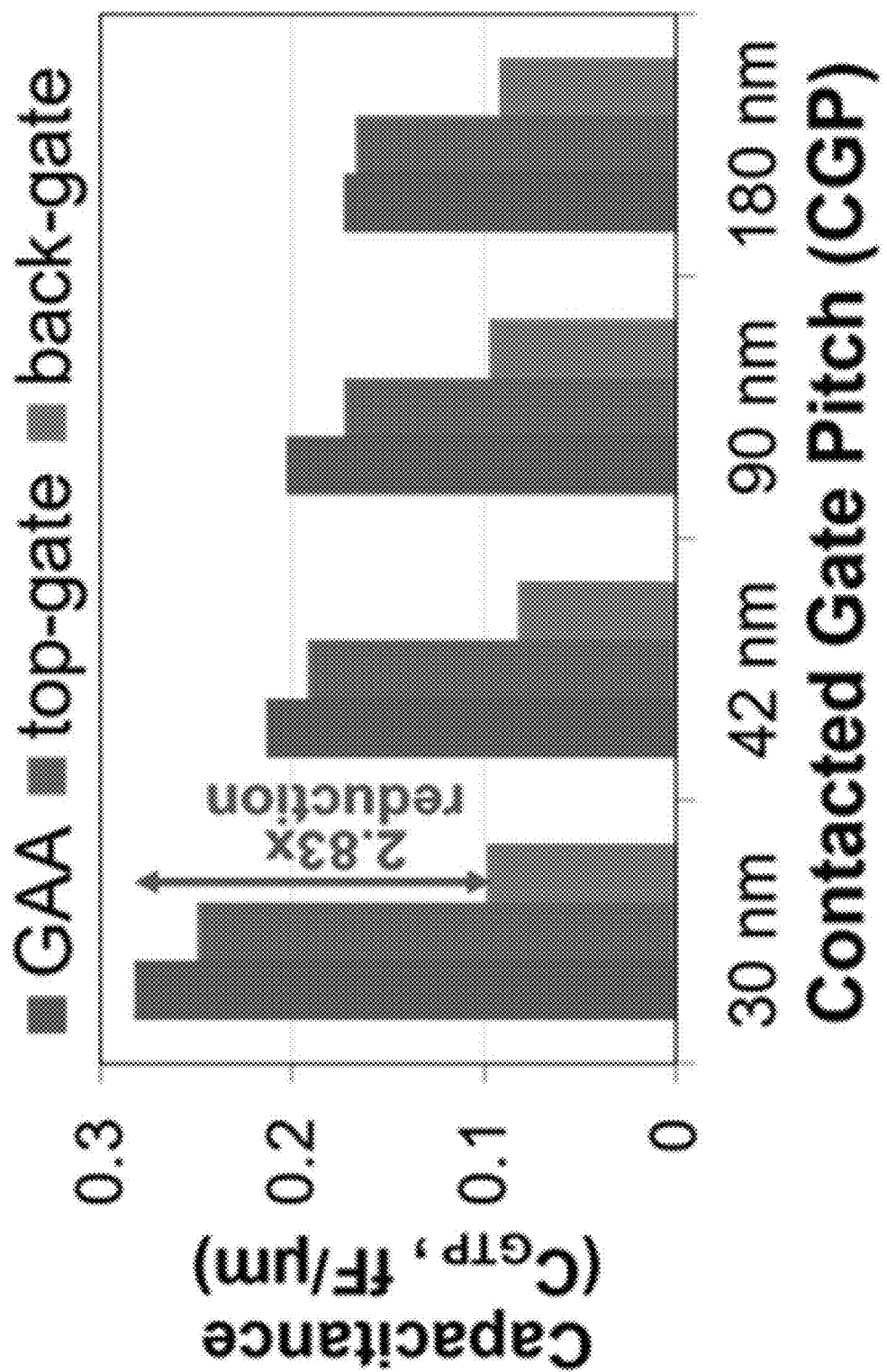
FIG. 8A shows the parasitic capacitances (gate-to-plug capacitance, $C_{GTP}$ in FIGS. 1A-1E) for back-gate vs. top-gate and gate-all-around (GAA) FET. Back-gate FETs reduces parasitics by >2.5× vs. top-gate FETs and by >2.8× vs. GAA FETs (suitable for a 30 nm CGP suitable for a sub-3 nm node). Benefits of parasitic reduction increases as CGP scales. Intrinsic parasitics are determined using TCAD Sentaurus (Synopsys) and verified using COMSOL Multiphysics (COMSOL, Inc.) (with a discrepancy of <0.3% across all simulations).

FIG. 8A shows that at a CGP of 30 nm, the parasitic capacitance for the back-gate FET 100 is 0.1 fF/μm. By comparison, the parasitic capacitance for the top-gate FET and the GAA FET are 0.25 fF/μm and 0.28 fF/μm, respectively. Thus, the parasitic capacitance of the top-gate FET and the GAA FET are >2.5× larger compared to the back-gate FET 100. Additionally, FIG. 8A shows the beneficial reduction in parasitic capacitance for back-gate FETs 100 increases as CGP continues to scale smaller. Such reduction in parasitic capacitances results in a lower EDP, which benefits digital VLSI circuits.

To quantify these EDP benefits, physical designs of digital VLSI circuits from the processor core of OpenSPARC T2 and a 32-bit commercial processor core were analyzed using standard cell layouts as well as industry-standard tools for synthesis, placement and routing, and parasitic extraction. These processor cores incorporate many effects present in realistic VLSI circuits that do not appear in small-scale circuit benchmarks, ranging from physical placement and routing congestion, to wire parasitics and buffer insertion to meeting circuit-level timing constraints.

Figure 9A:
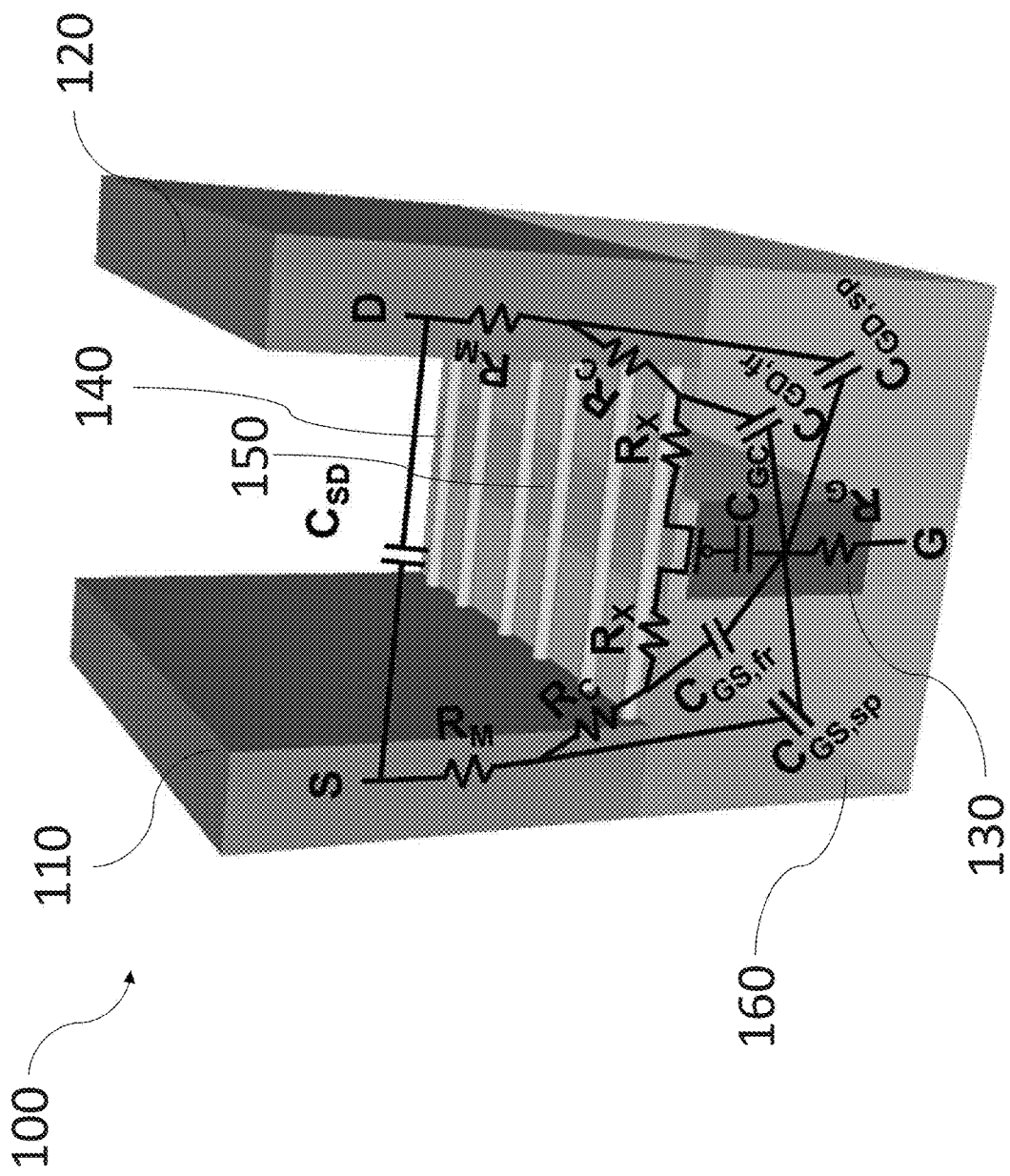
FIG. 9A shows a perspective view of a back-gate CNFET, with labelled parasitic components.
Figure 9B:
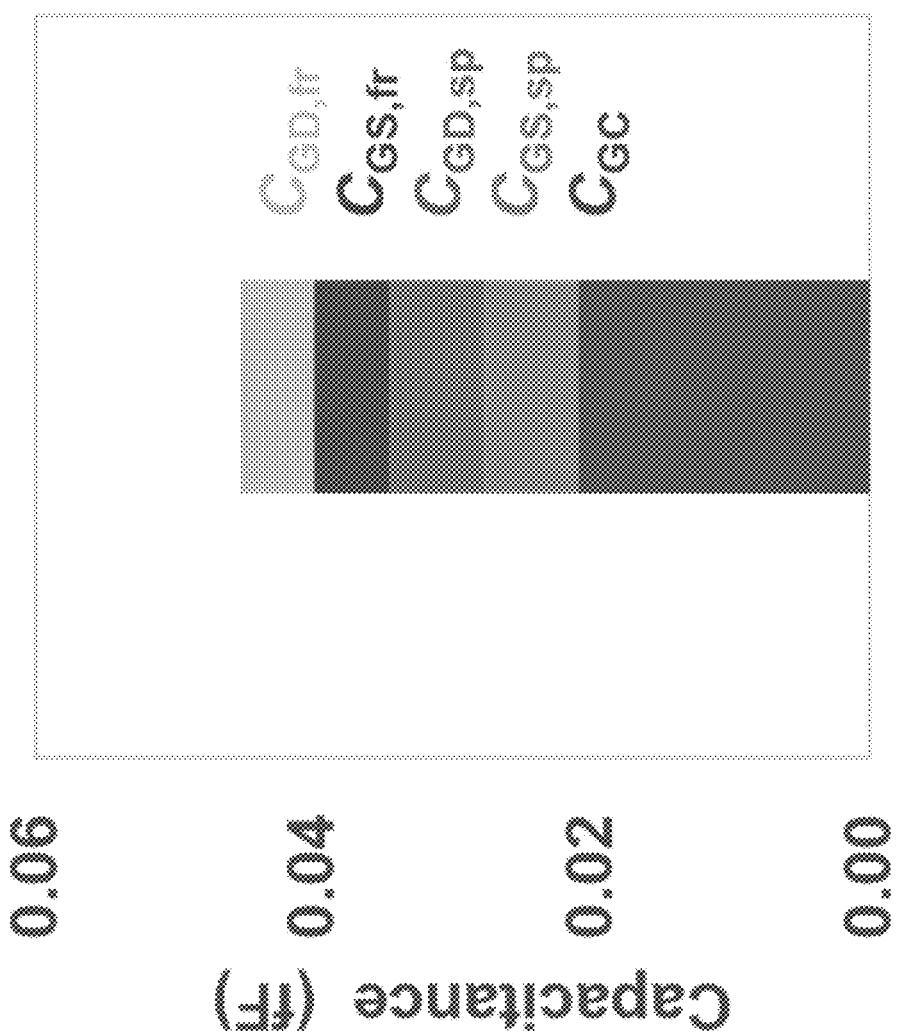
FIG. 9B shows different components of input capacitance for a highly scaled 30 nm CGP back-gate CNFET (see device parameters in FIG. 8B).

CNFET-level capacitance components are determined using a commercial 3D field solver (Synopsys Sentaurus), to extract values for the parasitic capacitors shown in FIG. 9A. In particular, these parasitic capacitances include: $C_{GS,sp}$ and $C_{GD,sp}$ (gate-to-source/drain contact capacitance), $C_{GS,fr}$ and $C_{GD,fr}$ (fringe capacitance from the gate the CNTs in the spacer region on both the source/drain sides), and $C_{SD}$ (direct source-to-drain capacitance between the metal contacts). Each of these capacitances is extracted separately for each CNFET geometry (top-gate, back-gate, gate-all-around). Intrinsic gate-to-channel capacitance ($C_{GC}$ in FIG. 9A) is computed using a SPICE-compatible CNFET compact model. These CNFET level capacitances are used in conjunction with standard cell-level capacitances (e.g., for local metal interconnects, extracted using Mentor Graphics Calibre) to characterize standard cell library power/timing, and then metal routing parasitics are extracted during place-and-route (Synopsys IC Compiler).

The physical design flow for VLSI circuits is as follows: the circuit-level performance metrics for physical designs for each VLSI-scale circuit module (i.e., from the OpenSparc T2 processor core and for the 32 bit commercial processor core) are quantified at the 3 nm node (details in FIG. 8B) across multiple device-level performance metrics, including (but not limited to): supply voltage ($V_{DD}$=375 mV to 500 mV), sub-threshold slope (SS) degradation (from 0% to 60%), and interconnect simulator to model extrinsic elements based on the CNFET geometry and material properties (e.g., on the dimensions and resistivity of the source/drain metal contact plugs). For each combination of parameters (e.g., for each $V_{DD}$, SS, top-gate vs. bottom-gate), the following design flow is used to quantify relative EDP (e.g., as in FIG. 10) for all VLSI circuit modules:

1. Standard cell library characterization: using standard cell layouts (derived from the 15 nm node Nangate Open Cell Library) are used to extract standard cell parasitics, and then the extracted netlists are used in conjunction with the experimentally calibrated compact transistor models to characterize power and timing (using Cadence Spectre) for each standard library cell 2. Synthesis: using Synopsys Design Compiler, synthesize each circuit module over a range of target clock frequencies (from 1 GHz to 10 GHz), since operating clock frequency after optimizing circuit EDP can vary depending on the device-level parameters (e.g., $V_{DD}$).

3. Placement & routing: using Synopsys IC Compiler perform placement and routing for each synthesized netlist (for each target frequency), allowing for physical circuit optimization such as buffer insertion to meet circuit timing constraints.

4. Power/timing analysis: perform power and timing analysis for each physical design (using Synopsys PrimeTime) placed and routed above, over several retargeted clock frequencies spanning the range from 0.1 GHz up to 10 GHz in 0.1 GHz increments (i.e., readjust the timing constraints in steps 2 and 3 targeting a different clock frequency), since it can be potentially more energy efficient to operate at a separate clock frequency than that was specified during synthesis and place and route.

Figure 10:
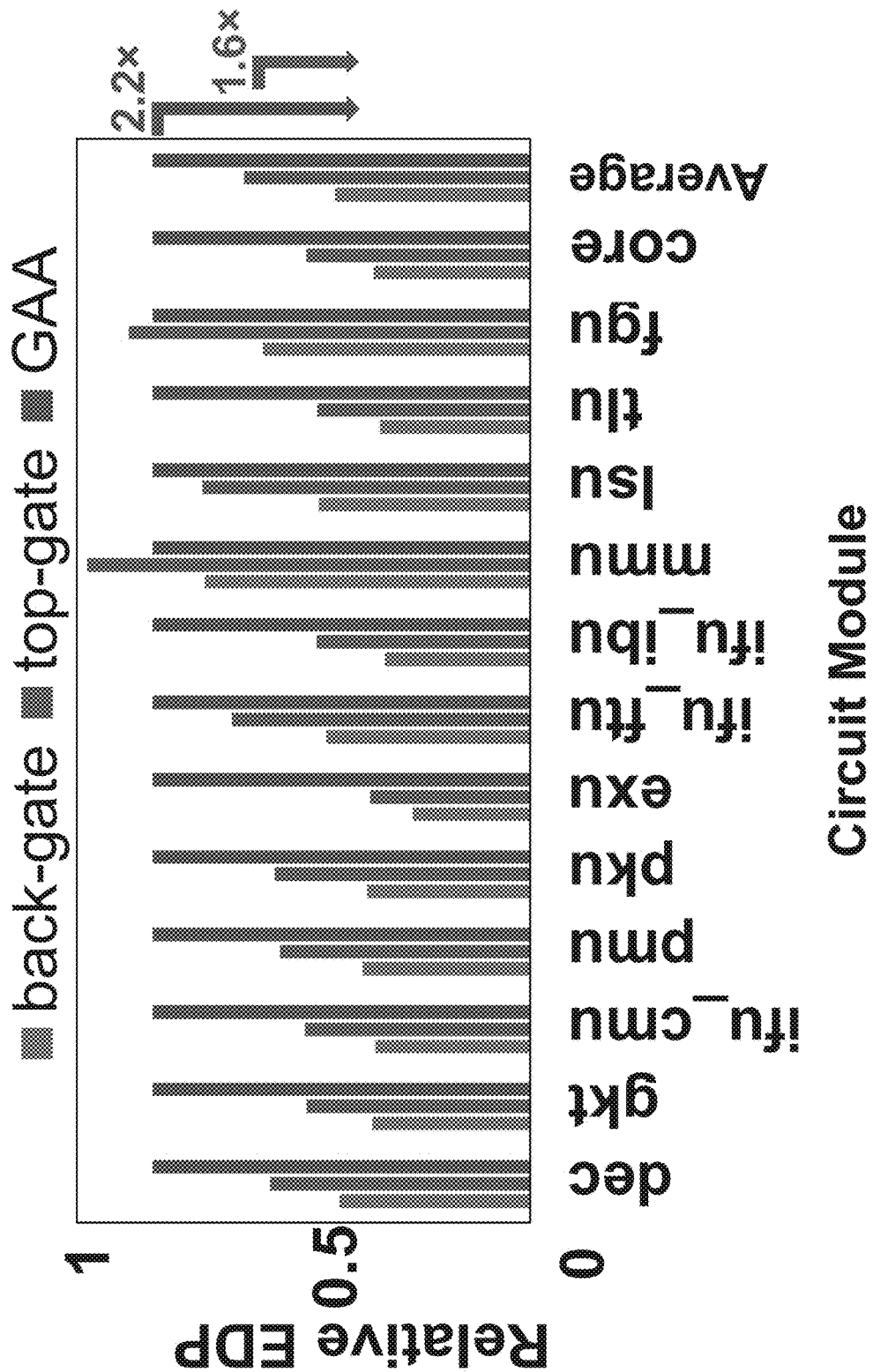
FIG. 10 shows the optimized EDP (normalized with respect to the optimized EDP for the GAA CNFET for each module) across modules from the OpenSparc T2 core and a 32-bit commercial processor core. Average EDP benefit of back-gate vs. GAA is 2.18×, and 1.6× vs. top-gate. All simulations were done with respect to a 30 nm CGP device with parameters listed in FIG. 8B. EDP benefits are maintained even with low-k spacers (e.g., with a k=4.4 spacer) with EDP benefits decreasing by <10% (from the "dec" module of OpenSparcT2). Moreover, for many existing standard cell libraries, the same physical layouts can be used for FETs with back-gate geometries without any adjustments to the locations of FETs or to the metal routing within standard library cells (specifically for standard cell layouts in which vias to contact FET gates are located outside of the active region of the FETs).

FIG. 10 shows the reduced EDP (normalized with respect to the improved EDP for the GAA CNFET for each module) across modules of OpenSparc T2 and the 32-bit commercial processor core. Owing to reduced parasitic capacitances, back-gate CNFETs 100 provide an average of 2.2×EDP benefit vs. GAA CNFETs and 1.6× vs. top-gate CNFETs. Importantly, these benefits are in addition to the substantial EDP benefits that top-gate CNFETs offer vs. Si FETs.

Figure 11:
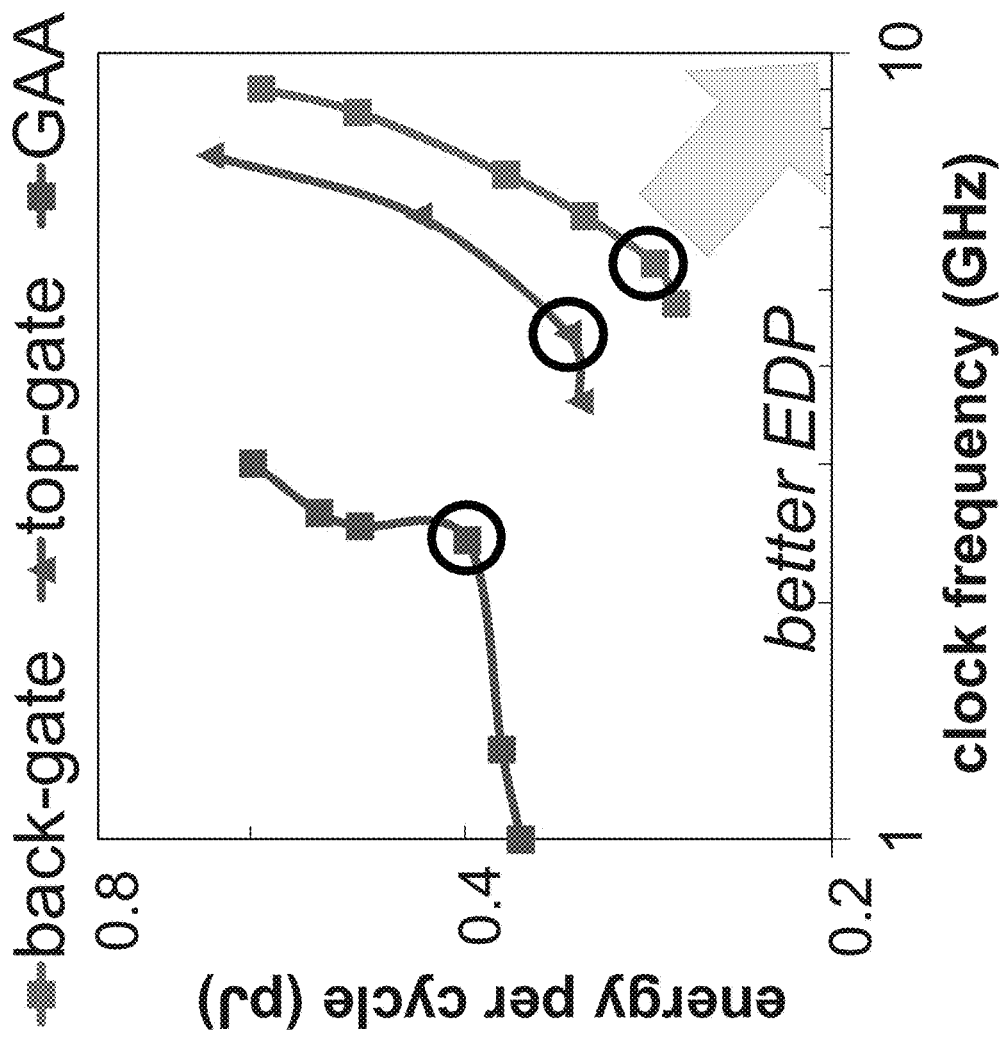
FIG. 11 shows the total energy vs. frequency of the 32-bit commercial processor core, showing the pareto-optimal EDP trade-off curves for back-gate, top-gate, and GAA CNFETs.

FIG. 11 shows the energy per cycle as a function of the clock frequency for back-gate CNFETs 100 in comparison to top-gate and GAA CNFETs. Generally, a lower EDP corresponds to a lower energy per cycle at a higher clock frequency. As shown, the back-gate CNFETs 100 exhibit a lower energy per cycle than the top-gate and GAA CNFETs at a given clock frequency. This corresponds directly to the EDP benefit shown in FIG. 10.

Additional Considerations

Figure 12:
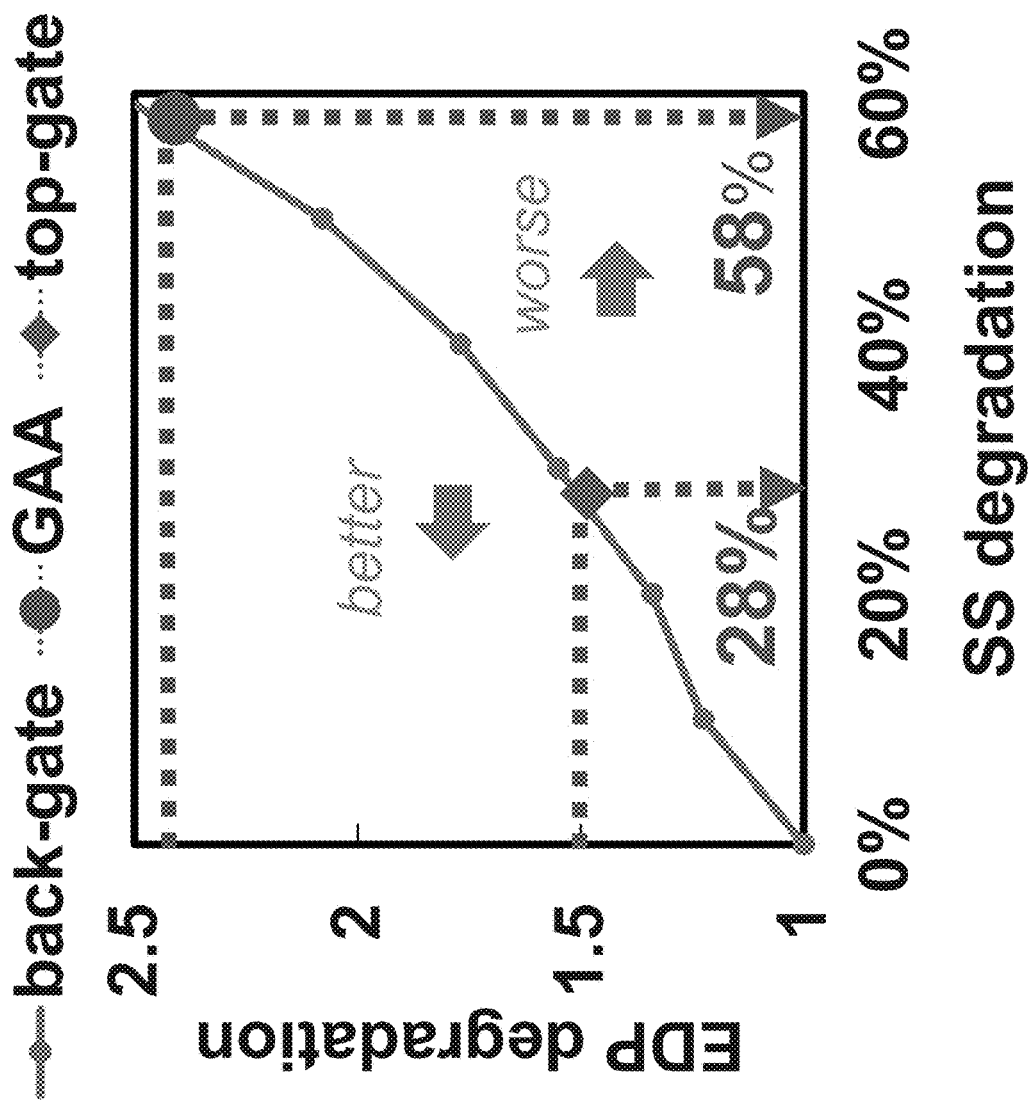
FIG. 12 shows the EDP benefits resulting from reduced parasitics outweigh potential gains stemming from improved electrostatic control for GAA geometries. Sub-threshold swing (SS) can degrade by >58% (resulting in SS=100 mV/dec), while still maintaining the EDP benefits compared to GAA CNFETs with an assumed preferred SS approaching 60 mV/dec. Importantly, experimental demonstrations of CNFETs with $L_{CH}$=9 nm have leveraged back-gate geometries and reported a SS better than 100 mV/dec (94 mV/dec), highlighting feasibility of this approach.

The reduced parasitics that result in lower EDP may also outweigh potential gains stemming from improved electrostatic control for GAA geometries. For example, the sub-threshold-swing (SS) for the back-gate CNFET 100 may degrade from ~60 mV/decade to ~100 mV/decade, while still maintaining EDP benefits compared to GAA CNFETs with nearly ideal SS approaching 60 mV/decade as demonstrated in FIG. 12.

Figure 13A:
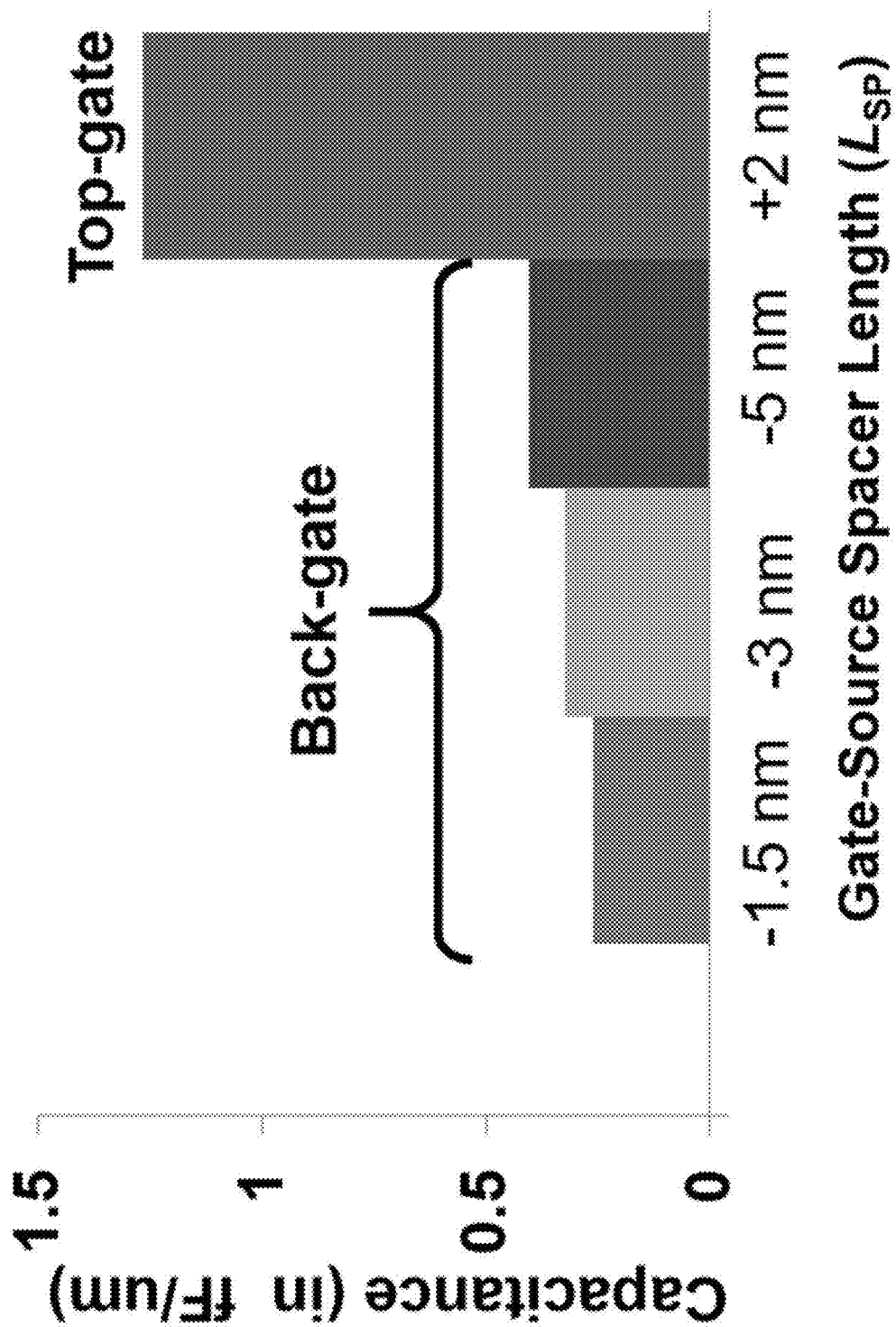
FIG. 13A shows a chart of the parasitic capacitance ($C_{GTP}$) as a function of the spacer length $L_{SP}$ for a top-gate FET and back-gate FETs with a 5 nm, a 3 nm, and a 1.5 nm overlap between the gate and source/drain. The chart indicates how the back-gate FET geometry may be used to realize a 15 nm CGP. Even with overlap, back-gates yield >3× reduced parasitic capacitances at scaled nodes.
Figure 14:
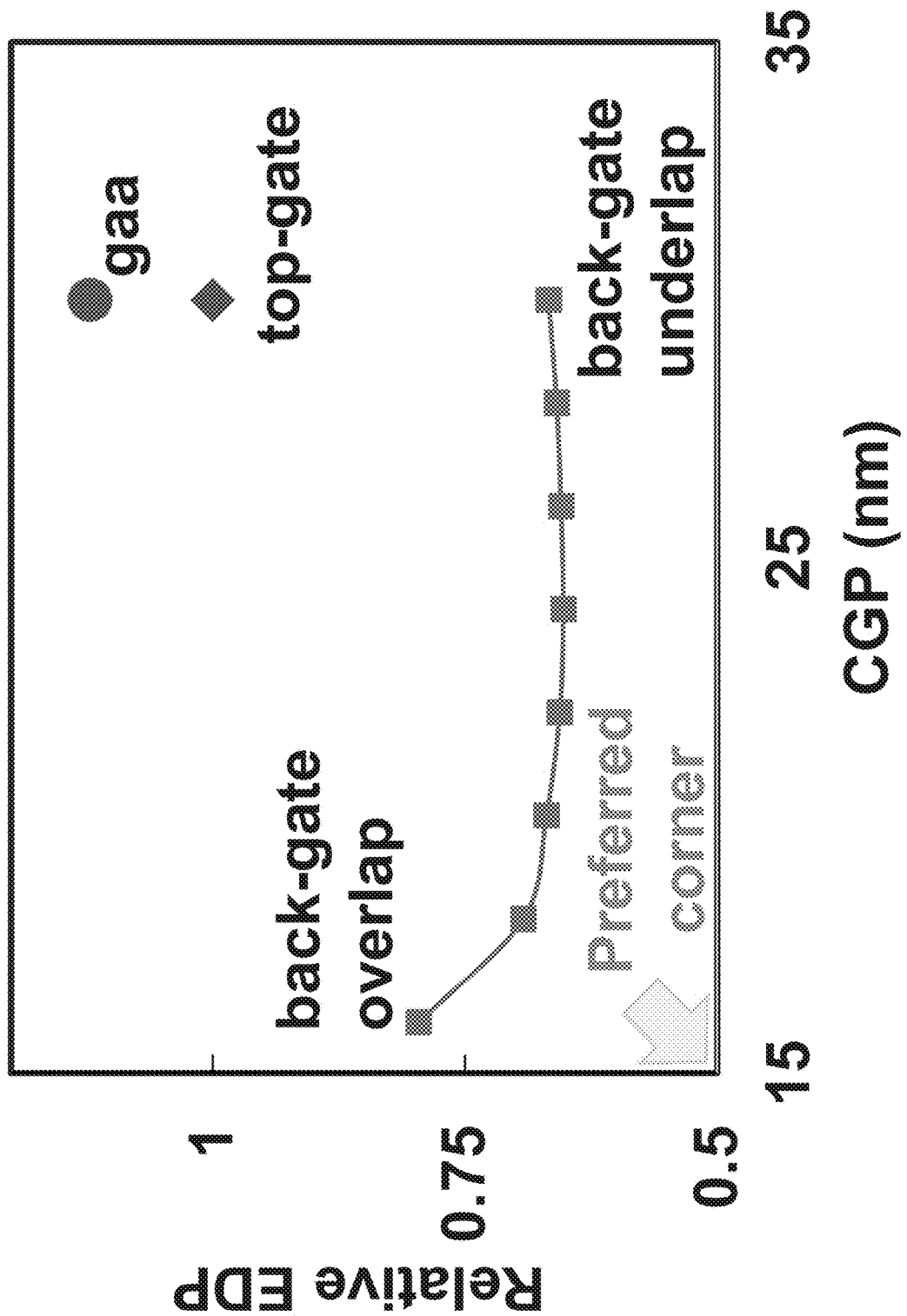
FIG. 14 shows a comparison of relative EDP of a fan-out 4 (FO-4) inverter (normalized to EDP of CGP 30 nm top-gate CNFET) versus CGP of back-gate CNFETs. These devices have a contact length $L_c$ of 9 nm and a gate length $L_g$ of 9 nm. The spacer length $L_{SP}$ is varied to reduce CGP.

In addition to showing scalability to a 30 nm CGP, this approach allows scaling to sub-20 nm CGP, using technology parameters that have already been achieved experimentally (FIG. 13). For instance, a 9 nm $L_G$, a 9 nm $L_C$, and an overlap of the gate and the source and drain (-$L_{SP}$) of 3 nm would result in a CGP of 15 nm. Importantly, even when assuming an overlap of the gate with the source and drain for back-gate FETs 100, the parasitics may still be less than a conventional top-gate FET at the same CGP (FIG. 13). The overlap of 3 nm (1) enables 15 nm CGP given experimentally realized dimensions for $L_C$ and $L_G$ and (2) exceeds the projected lithographic overlap accuracy, ensuring that some section of the gate is under the entire channel to maintain electrostatic control. For such aggressively scaled sub-20 nm CGPs, EDP benefits degrade compared to 30 nm CGP, though still maintain EDP benefits compared to 30 nm CGP top-gate CNFETs (FIG. 14).

As described above, the back-gate FET 100 architecture described herein provides an approach to realize scaled technology nodes, which may enable continued scaling to sub-3 nm technology nodes. In one exemplary back-gate FET 100, low-temperature solution processing of CNTs may be used to realize back-gate FETs 100. This approach not only enables additional scaling, but promises significant energy efficiency benefits by combining the EDP benefits afforded by CNTs with the EDP benefits associated with reducing parasitic capacitances in back-gate FETs. This approach is applicable to a broad range of emerging channel materials, such as one-dimensional and two-dimensional nanomaterials, especially if the channel materials satisfy: (1) the constraints of <400° C. channel deposition and subsequent FET processing and (2) thin body thickness (to maintain good electrostatic control of the channel). Moreover, CGP scaling may be achieved in back-gate FETs 100 without requiring scaling of the physical gate length ($L_G$) or contact length ($L_C$), and is complementary to other paths for maintaining area reduction per node. Therefore, beyond demonstrating a FET scaling of a 30 nm CGP using materials and processing suitable for a sub-3 nm technology node, this work also illustrates a promising and feasible path for continued scaling beyond the limits of silicon-based technologies.

CONCLUSION

All parameters, dimensions, materials, and configurations described herein are meant to be exemplary and the actual parameters, dimensions, materials, and/or configurations will depend upon the specific application or applications for which the inventive teachings is/are used. It is to be understood that the foregoing embodiments are presented primarily by way of example and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which at least one example has been provided. The acts performed as part of the method may in some instances be ordered in different ways. Accordingly, in some inventive implementations, respective acts of a given method may be performed in an order different than specifically illustrated, which may include performing some acts simultaneously (even if such acts are shown as sequential acts in illustrative embodiments).

All publications, patent applications, patents, and other references mentioned herein are incorporated by reference in their entirety.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A transistor comprising:
   a substrate;
   a dielectric layer disposed on the substrate;
   a channel having a first side facing away from the dielectric layer and a second side opposite the first side and disposed on the dielectric layer;
   a source disposed on the first side of the channel;
   a drain disposed on the first side of the channel and spaced apart from the source by a physical channel length of less than about 10 nm; and
   a gate disposed between the substrate and the dielectric layer and having a gate length greater than the physical channel length and a surface extending from the substrate.

2. The transistor of claim 1, wherein the transistor has a contacted gate pitch of 15 nm to 30 nm.

3. The transistor of claim 1, wherein the transistor has a parasitic capacitance of less than 0.1 femtofarads/micron.

4. The transistor of claim 1, wherein the channel comprises a nanotube in electrical communication with the source and the drain.

5. The transistor of claim 4, further comprising:
   a dielectric disposed between the gate and the nanotube.

6. The transistor of claim 1, wherein the gate overlaps at least one of the source or the drain.

7. The transistor of claim 1, wherein the transistor is configured to operate at a clock frequency ranging between about 0.1 GHz and about 10 GHz.

8. The transistor of claim 1, wherein the source extends beyond a first edge of the gate and the drain extends beyond a second edge of the gate opposite the first edge and further comprising:
   a source contact in electrical communication with the source; and
   a drain contact in electrical communication with the drain.

9. A transistor comprising:
a channel having a first side and a second side opposite the first side;
a source disposed on a first side of the channel;
a drain disposed on the first side of the channel; and
a gate, disposed on the second side of the channel, overlapping at least one of the source or the drain,
wherein the transistor has a contacted gate pitch of 15 nm to 30 nm and a parasitic capacitance of less than 0.1 femtofarads/micron and is configured to operate at an energy per cycle of less than 0.4 pJ at a clock frequency of 7 GHz or higher.

10. The transistor of claim 9, wherein the channel comprises a nanotube in electrical communication with the source and the drain.

11. The transistor of claim 10, further comprising:
a dielectric disposed between the gate and the nanotube.

12. The transistor of claim 9, wherein the transistor is configured to operate at a clock frequency ranging between about 0.1 GHz and about 10 GHz.

13. A method of making a transistor, the method comprising:
forming a gate;
depositing a dielectric on the gate;
depositing a carbon nanotube over the dielectric to form a channel;
patterning one of a source or a drain on the channel opposite the gate; and
after patterning the one of the source or the drain, patterning the other of the source or the drain on the channel opposite the gate with a physical channel length less than a length of the gate and less than about 10 nm.

14. The method of claim 13, wherein depositing the carbon nanotube occurs at a temperature of less than about 400 degrees Celsius.

15. The method of claim 13, wherein patterning the one of the source or the drain comprises lithographically etching with the physical channel length at a minimum feature size.

16. The method of claim 13, wherein patterning the one of the source or the drain comprises overlapping the one of the source or the drain with the gate.

17. The method of claim 13, further comprising:
before forming the gate, patterning a trench into a substrate such that the gate, when formed, is embedded in the substrate.

18. The method of claim 13, wherein forming the gate comprises depositing a gate material on a substrate and patterning the gate material.

* * * * *